(12) United States Patent
Oohashi

(10) Patent No.: US 8,420,295 B2
(45) Date of Patent: Apr. 16, 2013

(54) LITHOGRAPHIC PRINTING PLATE PRECURSOR

(75) Inventor: Hidekazu Oohashi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 874 days.

(21) Appl. No.: 12/412,928

(22) Filed: Mar. 27, 2009

(65) Prior Publication Data

US 2009/0246690 A1    Oct. 1, 2009

(30) Foreign Application Priority Data

Mar. 27, 2008 (JP) ................. 2008-084980

(51) Int. Cl.
*G03F 7/004* (2006.01)
(52) U.S. Cl.
USPC ......... 430/272.1; 430/302; 101/465; 101/467
(58) Field of Classification Search .................. 430/302, 430/272.1; 101/465, 467
See application file for complete search history.

(56) References Cited

U.S. PATENT DOCUMENTS

| | | | |
|---|---|---|---|
| 2,850,445 A | 9/1958 | Oster | |
| 4,708,925 A | 11/1987 | Newman | |
| 6,030,750 A | 2/2000 | Vermeersch et al. | |
| 6,132,935 A | 10/2000 | Kobayashi et al. | |
| 6,599,674 B1 * | 7/2003 | Kawamura | 430/270.1 |
| 2001/0018159 A1 | 8/2001 | Maemoto | |
| 2002/0031715 A1 | 3/2002 | Maemoto et al. | |
| 2002/0102488 A1 | 8/2002 | Yanaka et al. | |
| 2002/0117066 A1 | 8/2002 | Kawamura et al. | |
| 2005/0175934 A1 * | 8/2005 | Koizumi | 430/270.1 |
| 2006/0040117 A1 * | 2/2006 | Hayashi et al. | 428/457 |
| 2006/0269873 A1 * | 11/2006 | Knight et al. | 430/302 |
| 2008/0044767 A1 * | 2/2008 | Tao et al. | 430/287.1 |

FOREIGN PATENT DOCUMENTS

| | | |
|---|---|---|
| EP | 0 965 887 A1 | 12/1999 |
| EP | 1 892 572 A1 | 2/2008 |
| JP | 44-20189 B | 8/1969 |
| JP | 08-276558 A | 10/1996 |
| JP | 2938397 B2 | 6/1999 |
| JP | 2000-211262 A | 8/2000 |
| JP | 2001-166491 A | 6/2001 |
| JP | 2001-277740 A | 10/2001 |
| JP | 2002-29162 A | 1/2002 |
| JP | 2002-046361 A | 2/2002 |
| JP | 2002-137562 A | 5/2002 |
| JP | 2002-326470 A | 11/2002 |
| JP | 2003-063166 A | 3/2003 |
| JP | 2004-114565 A | 4/2004 |
| JP | 2004-133165 A | 4/2004 |
| JP | 2004-276603 A | 10/2004 |
| JP | 2006-078999 A | 3/2006 |
| JP | 2006-248113 A | 9/2006 |
| JP | 2006-321141 A | 11/2006 |
| JP | 2007-237517 A | 9/2007 |
| JP | 2007-245662 A | 9/2007 |

OTHER PUBLICATIONS

Partial European Search Report issued in European Patent Application No. 09004352.2-1226, dated Jul. 16, 2009.
Extended European Search Report issued in European Patent Application No. 09004352.2-1226, dated Oct. 29, 2009.
Partial English-language translation of JP 2006-321141 A published Nov. 30, 2006.
Partial English-language translation of JP 2007-245662 A published Sep. 27, 2007.
Partial English-language translation of JP 2007-237517 A published Sep. 20, 2007.
Office Action issued Mar. 13, 2012 in Japanese Application No. 2008-084980.
Office Action dated Jul. 31, 2012 in Japanese Application No. 2008-084980.

\* cited by examiner

*Primary Examiner* — John Chu
(74) *Attorney, Agent, or Firm* — Sughrue Mion, PLLC

(57) ABSTRACT

A lithographic printing plate precursor includes a support and a layer containing a polymer compound having at least one support-adsorbing group at a terminal of a main chain.

15 Claims, 1 Drawing Sheet

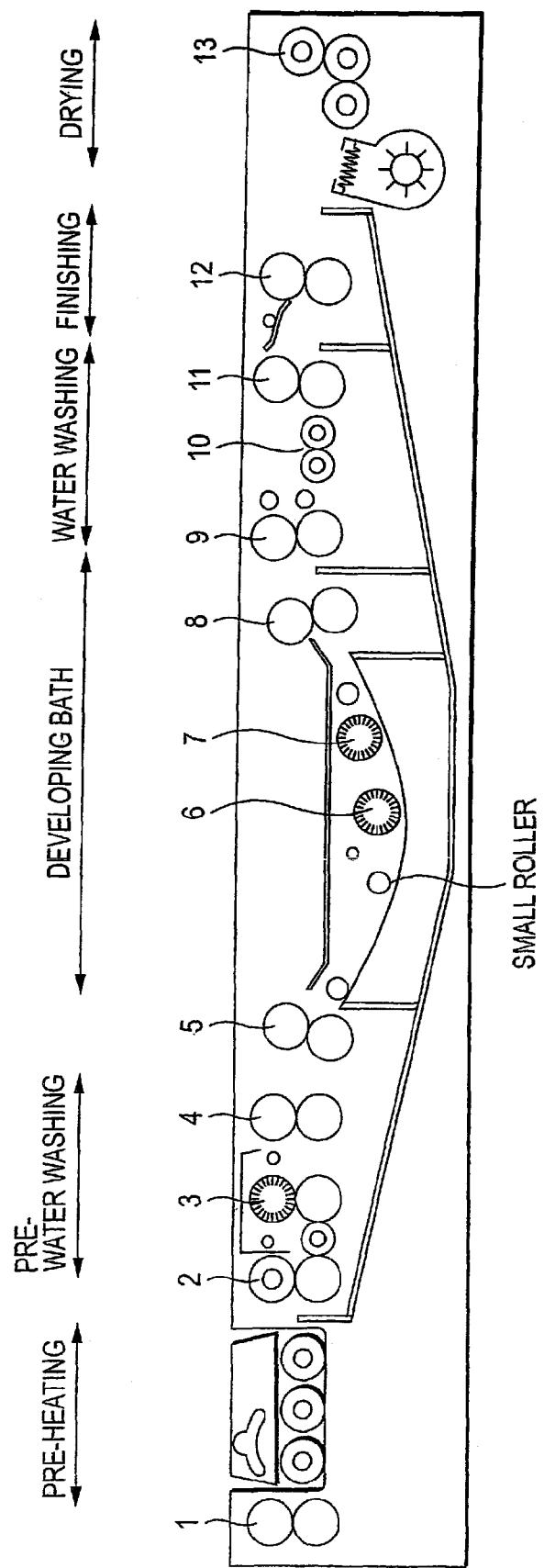

LITHOGRAPHIC PRINTING PLATE PRECURSOR

FIELD OF THE INVENTION

The present invention relates to a lithographic printing plate precursor which is capable of being subjected to a so-called direct plate making, in which the plate making is directly conducted based on digital signals, for example, from a computer using various kinds of lasers, particularly, to a lithographic printing plate precursor suitable for a simple processing.

BACKGROUND OF THE INVENTION

A solid laser, semiconductor laser and gas laser having a large output and a small size, which radiate an ultraviolet ray, visible light or infrared ray having a wavelength of 300 to 1,200 nm, have become easily available, and these lasers are very useful for recording light sources used in the direct plate making based on digital data, for example, from a computer. Various investigations on recording materials sensitive to such various laser beams have been made. Typical examples thereof include firstly recording materials capable of being recorded with a infrared laser having a wavelength of not less than 760 nm, for example, positive type recording materials described in U.S. Pat. No. 4,708,925 and acid catalyst crosslinking type negative type recording materials described in JP-A-8-276558 (the term "JP-A" as used herein means an "unexamined published Japanese patent application"), and secondly recording materials responsive to an ultraviolet ray or visible light laser having a wavelength of from 300 to 700 nm, for example, radical polymerization type negative type recording materials described in U.S. Pat. No. 2,850,445 and JP-B44-20189 (the term "JP-B" as used herein means an "examined Japanese patent publication").

Further, with respect to hitherto known lithographic printing plate precursors (hereinafter, also referred to as PS plates), a step of removing the non-image area by dissolution (development processing) is indispensable and a post-processing step, for example, washing the printing plate after the development processing with water, treatment of the printing plate after the development processing with a rinse solution containing a surfactant or treatment of the printing plate after the development processing with an oil-desensitizing solution containing gum arabic or a starch derivative, is also necessary. The point that such additional wet treatments are indispensable is a large subject of investigation in hitherto known PS plates. Even when the first half (image-forming process) of plate making process is simplified by the above-described digital processing, the effects due to the simplification is still insufficient as long as the last half (development processing) is the troublesome wet treatment.

Particularly, the consideration for global environment has become a great concern throughout the field of industry in recent years. In view of the consideration for global environment, a treatment with a developer closer to a neutral range and a small amount of waste liquid are subjects of further investigations. Further, it is desirable that the wet type post-processing is simplified or changed to a dry processing.

From this viewpoint, as one method for eliminating the processing step, a method referred to as on-press development wherein an exposed printing plate precursor is mounted on a cylinder of a printing machine and the non-image area of the printing plate precursor is removed by supplying dampening water and ink while rotating the cylinder is known. Specifically, according to the method, the printing plate precursor is exposed and mounted on a printing machine as it is to complete development processing in a conventional process of printing.

A lithographic printing plate precursor suitable for the on-press development is required to have an image-forming layer soluble in dampening water or an ink solvent and to have a bright room handling property suitable for development on a printing machine placed in a bright room. However, it is substantially impossible for hitherto known PS plates to fulfill such requirements.

In order to fulfill such requirements, a lithographic printing plate precursor having provided on a hydrophilic support an image-forming layer in which fine particles of thermoplastic hydrophobic polymer are dispersed in a hydrophilic binder polymer is proposed (see, for example, Japanese Patent 2,938,397). In the plate making, the lithographic printing plate precursor is exposed to an infrared laser to agglomerate (fuse) the fine particles of thermoplastic hydrophobic polymer by heat generated by light-to-heat conversion thereby forming an image, and mounted on a cylinder of a printing machine to carry out on-press development by supplying at least any one of dampening water and ink. Since the lithographic printing plate precursor has the sensitive zone in an infrared region, it also has the handling property in a bright room.

However, the image formed by the agglomeration (fusion) of the fine particles of thermoplastic hydrophobic polymer is insufficient in strength and has a problem of printing durability as a printing plate.

Lithographic printing plate precursors including microcapsules containing a polymerizable compound incorporated therein in stead of the thermoplastic fine particles are also proposed (see, for example, JP-A-2000-211262, JP-A-2001-277740, JP-A-2002-29162, JP-A-2002-46361, JP-A-2002-137562 and JP-A-2002-326470). In the lithographic printing plate precursors according to such a proposal, it is advantageous that the polymer image formed by a reaction of the polymerizable compound is excellent in the strength in comparison with the image formed by the fusion of the fine particles.

Also, since the polymerizable compound has high reactivity, many proposals for isolation of the polymerizable compound using microcapsules have been made. Further, it has been proposed to use a thermally degradable polymer in a shell of the microcapsule.

However, in the hitherto known lithographic printing plate precursors described in Japanese Patent 2,938,397, JP-A-2000-211262, JP-A-2001-277740, JP-A-2002-29162, JP-A-2002-46361, JP-A-2002-137562 and JP-A-2002-326470, printing durability of the image formed by laser exposure is insufficient and thus further improvements have been requested. Specifically, in such a lithographic printing plate precursor of a simple processing type, a support having a surface of high hydrophilicity is used in order to make possible development with an aqueous solution having pH of 10 or less or dampening water (ordinarily nearly neutral) on a printing machine and as a result, the image area is apt to be removed from the support by dampening water during printing and sufficient printing durability can not be obtained. On the contrary, when the surface of support renders hydrophobic, ink also adheres on the non-image area during printing to cause printing stain. Thus, it is extremely difficult to achieve a good balance between the printing durability and the stain resistance and a lithographic printing plate precursor of a simple processing type which provides good stain resistance and sufficient printing durability has not yet been known.

In JP-A-2001-166491, a support for lithographic printing plate precursor comprising a support having thereon a hydrophilic layer comprising a polymer compound which chemically bonds directly to a surface of the support and has a hydrophilic group is described. In JP-A-2003-63166 and JP-A-2004-276603, supports for lithographic printing plate precursor comprising an aluminum support or an aluminum support subjected to a silicate treatment having a hydrophilic surface in which a hydrophilic polymer having reactive group capable of chemically bonding to a surface of the support directly or through a constituting component having a crosslinked structure is chemically bonded are described. In JP-A-2006-78999, a lithographic printing plate precursor comprising a support and an image-recording layer containing a polymerization initiator, a polymerizable compound and a binder polymer soluble or swellable in water or an aqueous alkali solution and containing a copolymer including at least a repeating unit having at least one ethylenically unsaturated bond and a repeating unit having at least one functional group capable of interacting with a surface of the support in the image-recording layer or other layer is described.

SUMMARY OF THE INVENTION

Therefore, an object of the present invention is to provide a lithographic printing plate precursor which is capable of being subjected to a direct plate making based on digital data, for example, from a computer, by image-recording using a solid laser or semiconductor laser radiating an ultraviolet ray, visible light or infrared light, and particularly, capable of being developed with an aqueous solution having pH of 10 or less or on a printing machine, is excellent in developing property, has high sensitivity and is able to provide a lithographic printing plate having high printing durability and good stain resistance.

As a result of the intensive investigations, the inventors have found that the above-described object can be achieved by using a lithographic printing plate precursor described below.

Specifically, the present invention includes the following items.

(1) A lithographic printing plate precursor comprising a support and a layer containing a polymer compound having at least one support-adsorbing group at a terminal of its main chain.

(2) The lithographic printing plate precursor as described in (1) above, wherein the support-adsorbing group is a functional group adsorbing to an aluminum support.

(3) The lithographic printing plate precursor as described in (1) above, wherein the support-adsorbing group is a functional group adsorbing to a silicate.

(4) The lithographic printing plate precursor as described in any one of (1) to (3) above, wherein the support-adsorbing group is selected from functional groups represented by the following formulae (1) to (13):

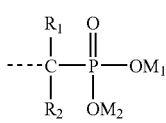
(1)

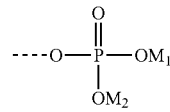
(2)

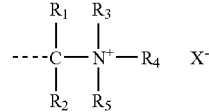
(3)

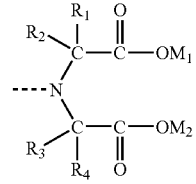
(4)

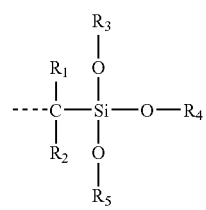
(5)

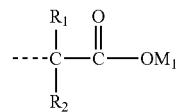
(6)

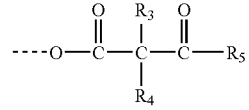
(7)

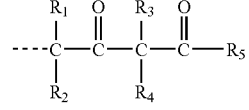
(8)

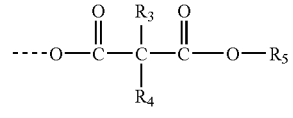
(9)

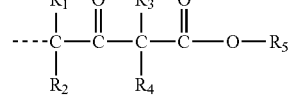
(10)

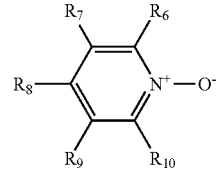
(11)

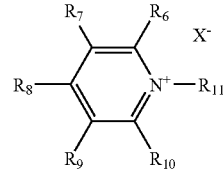
(12)

-continued

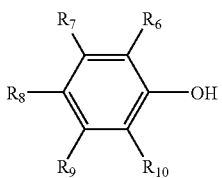
(13)

In formulae (1) to (13), a dotted line represents a bond to a connecting residue to the main chain of the polymer compound, $M_1$ and $M_2$ each represents a proton, a metal cation, an ammonium, a phosphonium, an iodonium, a sulfonium, a diazonium or an azinium, $R_1$ to $R_5$ each represents a hydrogen atom, an alkyl group, an aryl group, an alkynyl group or an alkenyl group, at least one of $R_6$ to $R_{11}$ represents a bond to a connecting residue to the main chain of the polymer compound and reminder of $R_6$ to $R_{11}$ each represents a hydrogen atom, a halogen atom, a cyano group, a nitro group or a monovalent organic residue, and $X^-$ represents a counter anion.

(5) The lithographic printing plate precursor as described in (4) above, wherein the support-adsorbing group is selected from the functional groups represented by formulae (1), (2) and (4), which are functional groups adsorbing to an aluminum support.

(6) The lithographic printing plate precursor as described in (4) above, wherein the support-adsorbing group is selected from the functional groups represented by formulae (3) and (4), which are functional groups adsorbing to a silicate.

(7) The lithographic printing plate precursor as described in any one of (1) to (6) above, wherein the polymer compound has at least two support-adsorbing groups at a terminal of its main chain.

(8) The lithographic printing plate precursor as described in any one of (1) to (7) above, wherein the polymer compound contains a unit (P1) having a hydrophilic functional group.

(9) The lithographic printing plate precursor as described in any one of (1) to (8) above, wherein the polymer compound contains a unit (P2) having a carbon-carbon unsaturated double bond.

(10) The lithographic printing plate precursor as described in any one of (1) to (9) above, wherein the polymer compound contains a unit (P3) having a hydrogen bond-forming group.

(11) The lithographic printing plate precursor as described in any one of (1) to (7) above, wherein the polymer compound contains a unit (P1) having a hydrophilic functional group and a unit (P2) having a carbon-carbon unsaturated double bond.

(12) The lithographic printing plate precursor as described in any one of (1) to (7) above, wherein the polymer compound contains a unit (P1) having a hydrophilic functional group and a unit (P3) having a hydrogen bond-forming group.

(13) The lithographic printing plate precursor as described in any one of (1) to (12) above, wherein the polymer compound has a weight average molecular weight of 1,000 or more.

(14) The lithographic printing plate precursor as described in any one of (1) to (13) above, further comprising an image-forming layer, wherein the layer containing a polymer compound having at least one support-adsorbing group at a terminal of its main chain is present between the image-forming layer and the support.

(15) The lithographic printing plate precursor as described in (14) above, wherein the layer containing a polymer compound having at least one support-adsorbing group at a terminal of its main chain contains a polymer compound other than the polymer compound having at least one support-adsorbing group at a terminal of its main chain.

(16) The lithographic printing plate precursor as described in (15) above, wherein the polymer compound other than the polymer compound having at least one support-adsorbing group at a terminal of its main chain is a polymer compound containing at least a unit having a support-adsorbing group and a unit (P1) having a hydrophilic functional group.

(17) The lithographic printing plate precursor as described in (14) above, wherein the image-forming layer contains a sensitizing dye, a polymerization initiator and a polymerizable compound.

(18) The lithographic printing plate precursor as described in any one of (1) to (13) and (15) and (16) above, wherein the layer containing a polymer compound having at least one support-adsorbing group at a terminal of its main chain is an image-forming layer further containing a sensitizing dye, a polymerization initiator and a polymerizable compound.

The function of the invention is presumed as follows. Specifically, by using a polymer compound having a support-adsorbing group at a terminal of its main chain, the main chain of the polymer compound can freely move without restraint by the support in contrast to a polymer compound having a support-adsorbing group in its side chain. Thus, the functional group of the polymer compound is apt to interact with the image-forming layer and as a result, an adhesion property of the image-forming layer increases to achieve high printing durability. On the other hand, in the non-image area, the hydrophilic functional group of the polymer compound is apt to interact with dampening water and as a result, dampening water retentivity in the non-image area increases to achieve good stain resistance.

According to the present invention, a lithographic printing plate precursor having high productivity which is capable of being subjected to a so-called direct plate making, in which the plate making is directly conducted based on digital signals, for example, from a computer using various kinds of lasers, and which is capable of being developed with an aqueous solution having pH of 10 or less or on a printing machine, is excellent in developing property, has high sensitivity and is able to provide a lithographic printing plate having high printing durability and good stain resistance can be obtained.

BRIEF DESCRIPTION OF THE DRAWINGS

FIG. 1 is an illustration for showing a structure of an automatic development processor.

DESCRIPTION OF REFERENCE NUMERALS AND SIGNS

1: Transport roller pair
2: Transport roller pair
3: Rotating brush roller
4: Transport roller pair
5: Transport roller pair
6: Rotating brush roller
7: Rotating brush roller
8: Transport roller pair
9: Transport roller pair
10: Backing roller
11: Transport roller pair
12: Transport roller pair
13: Transport roller pair

DETAILED DESCRIPTION OF THE INVENTION

In the specification, with respect to the description of a group in a compound represented by a formula, when the group is not indicated whether substituted or unsubstituted, unless otherwise indicated specifically, the group includes not only the unsubstituted group but also the substituted group, if the group is able to have a substituent. For example, the description "R represents an alkyl group, an aryl group or a heterocyclic group" in a formula means that "R represents an unsubstituted alkyl group, a substituted alkyl group, an unsubstituted aryl group, a substituted aryl group, an unsubstituted heterocyclic group or a substituted heterocyclic group".

The lithographic printing plate precursor according to the present invention will be described in detail below.

The lithographic printing plate precursor according to the invention comprises a support having provided thereon a layer containing a polymer compound (hereinafter, abbreviated as a terminal adsorbing polymer compound) having at least one support-adsorbing group at a terminal of its main chain.

The terminal adsorbing polymer compound is described in more detail below.

<Terminal Adsorbing Polymer Compound>

The terminal adsorbing polymer compound for use in the lithographic printing plate precursor according to the invention is a polymer compound having at least one support-adsorbing group at a terminal of its main chain.

As the support-adsorbing group, any functional group which adsorbs to an aluminum support or an aluminum support subjected to a silicate treatment, which is ordinarily used in a lithographic printing plate precursor, can be preferably used. The functional group adsorbing to a support is a functional group having a property described below.

Supports are immersed in a solution of a polymer compound having a functional group A and a solution of a polymer compound not having a functional group A respectively for 5 minutes, and the supports removed from each solution are thoroughly washed with the solvent used for dissolving the polymer compound and dried. When a residual carbon amount on each of the supports is measured by a fluorescent X ray, the residual carbon amount of the polymer compound having a functional group A is larger than the residual carbon amount of the polymer compound not having a functional group A.

For instance, supports are immersed in a 10% by weight solution of a polymer compound composed of 20% by mole of a methacrylic acid derivative having a functional group A and 80% by mole of methyl methacrylate and a 10% by weight solution of a polymer compound composed of 100% by mole of methyl methacrylate respectively for 10 minutes, and the supports removed from each solution are thoroughly washed with the solvent used for dissolving the polymer compound and dried. When a residual carbon amount on each of the supports is quantitated by a fluorescent X ray analyzer (RIX-3000, produced by Rigaku Corp.; X-ray source: Rh (50 kV, 50 mA), analysis area: 30 mmΦ, analyzing crystal: RX-60 (for C)), the residual carbon amount of the polymer compound having a functional group A is 1.1 time or more of the residual carbon amount of the polymer compound composed of methyl methacrylate.

Although any functional group having such a property to an aluminum support or an aluminum support subjected to a silicate treatment can be suitably used, preferable examples of the support-adsorbing group include functional groups represented by formula (1) to (13) shown below, and more preferable examples thereof include functional groups represented by formula (1) to (10) shown below.

(1)

(2)

(3)

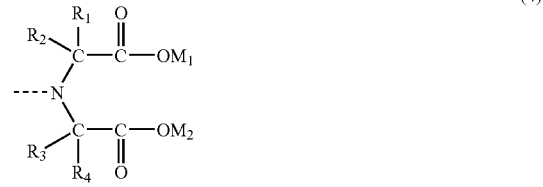

(4)

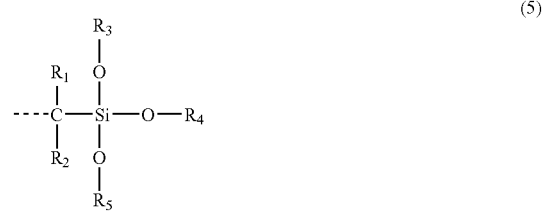

(5)

(6)

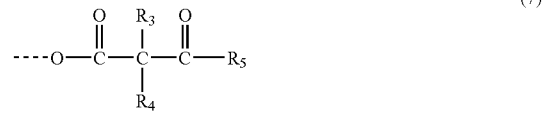

(7)

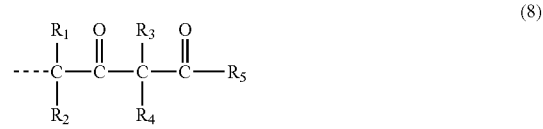

(8)

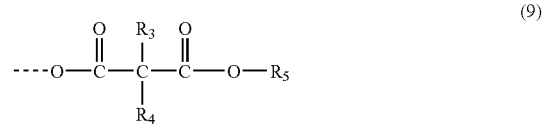

(9)

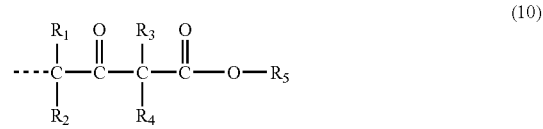

(10)

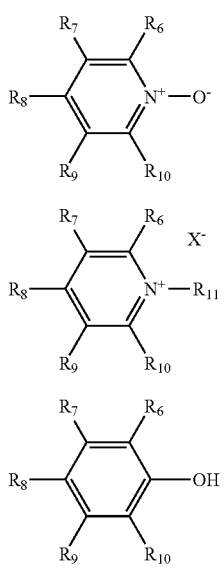

In formulae (1) to (13), a dotted line represents a bond to a connecting residue to the main chain of the polymer compound, $M_1$ and $M_2$ each represents a proton, a metal cation, an ammonium, a phosphonium, an iodonium, a sulfonium, a diazonium or an azinium, $R_1$ to $R_5$ each represents a hydrogen atom, an alkyl group, an aryl group, an alkynyl group or an alkenyl group, at least one of $R_6$ to $R_{11}$ represents a bond to a connecting residue to the main chain of the polymer compound and reminder of $R_6$ to $R_{11}$ each represents a hydrogen atom, a halogen atom, a cyano group, a nitro group or a monovalent organic residue, and $X^-$ represents a counter anion.

The bond to a connecting residue to the main chain of the polymer compound represented by the dotted line is a covalent bond to a connecting residue which links the main chain of the polymer compound and the support-adsorbing group as illustrated in a view using the functional group represented by formula (1) shown below.

The connecting residue is an organic residue which links at least one support-adsorbing group and the main chain of the polymer compound, preferably a divalent or higher valent organic residue, more preferably a trivalent or higher valent organic residue, and particularly preferably a tetravalent or higher valent organic residue. The organic residue comprises preferably hydrogen, carbon, oxygen, nitrogen, halogen, sulfur, phosphorus, silicon, sodium, potassium, lithium, magnesium, calcium, aluminum, iron, copper, zinc, cobalt, tin, manganese, nickel, titanium, vanadium, chromium, germanium, silver and lead, and more preferably hydrogen, carbon, oxygen, nitrogen, halogen, sulfur, phosphorus, silicon, sodium, potassium, lithium, magnesium, calcium and aluminum.

Specific examples of the metal cation represented by $M_1$ or $M_2$ include a cation formed from a metal, for example, lithium, sodium, potassium, magnesium, calcium, titanium, vanadium, chromium, manganese, iron, cobalt, nickel, copper, zinc, gallium, germanium, aluminum, silver or zirconium The cation formed from lithium, sodium, potassium, magnesium, calcium, titanium, vanadium, manganese, iron, cobalt, nickel, copper, zinc or aluminum is preferable, the cation formed from lithium, sodium, potassium, magnesium, calcium, zinc, copper, nickel, cobalt or iron is more preferable, and the cation formed from lithium, sodium, potassium, magnesium or calcium is particularly preferable.

Specific examples of the ammonium represented by $M_1$ or $M_2$ include an ammonium ion ($NH_4^+$), a proton adduct ($R-NH_3^+$) of a primary amine, for example, methylamine, ethylamine, butylamine, cyclohexylamine, ethylenediamine, aniline or phenylenediamine, a proton adduct ($R1R2-NH_2^+$) of a secondary amine, for example, dimethylamine, diethylamine, piperidine, morpholine or diphenylamine, a proton adduct ($R1R2R3-NH^+$) of a tertiary amine, for example, triethylamine, N-methylmorpholine or dimethylaniline, a quaternary ammonium ion, for example, tetramethylammonium, tetraethylammonium or phenyltrimethylammonium, a proton adduct of a nitrogen-containing aromatic compound, for example, pyridine or imidazole and an N-alkylated derivative of a nitrogen-containing aromatic compound, for example, N-methylpyridinium. The ammonium ion, proton adduct of a primary amine, proton adduct of a secondary amine, proton adduct of a tertiary amine and quaternary ammonium ion are preferable, the ammonium ion, proton adduct of a tertiary amine and quaternary ammonium ion are more preferable, and the quaternary ammonium ion is particularly preferable.

Specific examples of the phosphonium represented by $M_1$ or $M_2$ include a tetraarylphsphonium, for example, tetraphenylphsphonium, an alkyltriarylphophonium, for example, triphenylmethylphosphonium, xylylenebistriphenylphosphonium, ethylenebistriphenylphosphonium or cyclohexyltriphenylphosphonium, a dialkyldiarylphosphonium, for example, dimethyldiphenylphosphonium, a trialkylarylphosphonium, for example, trimethylphenylphosphonium and a tetraalkylphosphonium, for example, tetrabutylphosphonium or tributyloctylphosphonium. The tetraarylphsphonium and alkyltriarylphophonium are preferable.

Specific examples of the iodonium represented by $M_1$ or $M_2$ include a diaryliodonium, for example, diphenyliodonium or bis-tert-butylphenyliodonium.

Specific examples of the sulfonium represented by $M_1$ or $M_2$ include a triarylsulfonium, for example, triphenylsulfonium, trichlorophenylsulfonium, tritolylsulfonium or dichlorophenylhydroxyphenylsulfonium, a diarylalkylsulfonium, for example, diphenylethylsulfonium, an aryldialkylsulfonium, for example, phenyldiethylsulfonium and trialkylsulfonium, for example, tributylsulfonium. The triarylsulfonium is preferable.

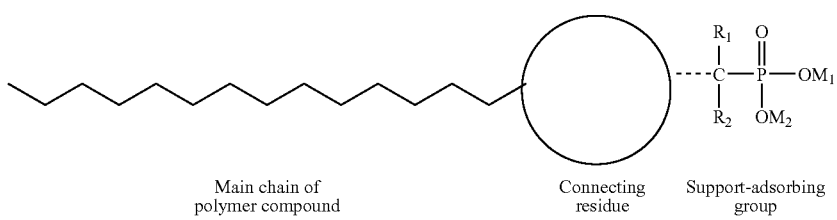

Specific examples of the diazonium represented by $M_1$ or $M_2$ include an aryldiazonium, for example, phenyldiazonium or naphthyldiazonium.

Specific examples of the azinium represented by $M_1$ or $M_2$ include an O-alkylated derivative of a nitrogen-containing aromatic ring N-oxide, for example, O-methylated derivative of pyridine N-oxide.

For $M_1$ or $M_2$, the proton, metal cation, ammonium ion and phosphonium ion are preferable, the proton, metal cation and ammonium ion are more preferable, and the proton and metal cation are particularly preferable.

A number of the positive charge of $M_1$ or $M_2$ is nor particularly restricted and is preferably from 1 to 4, more preferably from 1 to 3, and particularly preferably from 1 to 2.

Specific examples of the alkyl group, aryl group, alkenyl group and alkynyl group represented by any one of $R_1$ to $R_5$ are set for the below, but the invention should not be construes as being limited thereto.

Specific examples of the alkyl group represented by any one of $R_1$ to $R_5$ include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group, a 2-norbornyl group, a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

Specific examples of the aryl group represented by any one of $R_1$ to $R_5$ include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a nitrophenyl group, a cyanophenyl group, a sulfophenyl group, a sulfonatophenyl group, a phosphonophenyl group and a phosphonatophenyl group.

Specific examples of the alkenyl group represented by any one of $R_1$ to $R_5$ include a vinyl group, a 1-propenyl group, a 1-butenyl group, a cinnamyl group and a 2-chloro-1-ethenyl group.

Specific examples of the alkynyl group represented by any one of $R_1$ to $R_5$ include an ethynyl group, a 1-propynyl group, a 1-butynyl group and a trimethylsilylethynyl group.

At least one of $R_6$ to $R_{11}$ represents a bond to a connecting residue to the main chain of the polymer compound and reminder of $R_6$ to $R_{11}$ each represents a hydrogen atom, a halogen atom, a cyano group, a nitro group or a monovalent organic residue.

The monovalent organic residue represented by any one of $R_6$ to $R_{11}$ is preferably a monovalent organic residue having 6 or less carbon atoms and includes, for example, a methyl group, an ethyl group, a phenyl group, a methoxy group, an isobutoxy group, a carboxyl group, a methoxycarbonyl group, a methylthio group, an ethylcarbonyl group, an allyl group, a dimethylaminocarbonyl group, a morpholinocarbonyl group, a diethylamino group, a phenylamino group, a methylsulfido group, an ethylsulfoxido group, a propylsulfone group, a sulfonic acid group, a methoxysulfone group, an isopropylaminosulfone group, a trimethylsilyl group, a 3-bromopropyl group, a hydroxy group, a 2-hydroxyethyl group and a methoxymethyl group.

As the counter anion represented by $X^-$, any anion can be preferably used. Specific examples of the counter anion include a halogen ion (for example, $F^-$, $Cl^-$, $Br^-$ or $I^-$), a nitrate ion ($NO_3^-$), a sulfate ion ($SO_4^{2-}$), a hydrogen sulfate ion ($HSO_4^-$), a phosphate ion ($PO_4^{3-}$), a hydrogen phosphate ion ($HPO_4^{2-}$), a dihydrogen phosphate ion ($H_2PO_4^-$), a hypohalite ion (for example, $ClO^-$ or $BrO^-$), a halite ion (for example, $ClO_2^-$ or $BrO_2^-$), a halate ion (for example, $ClO_3^-$ or $BrO_3^-$), a perhalate ion (for example, $ClO_4^-$, $BrO_4^-$ or $IO_4^-$), a tetrahalogenoborate ion (for example, $BF_4^-$), a tetraaryl borate ion (for example, $Ph_4B^-$), a hexahalogenophosphate ion (for example, $PF_6^-$), and a carboxylate ion, a benzoate anion, a carbonamide ion, a sulfonate ion, a sulfinate ion, a thiosulfonate ion, a sulfonimide ion, a sulfate ester ion, a sulfate amide ion, a phosphate ester ion, a phosphate diester ion, a phosphonate ion and a phosphonate ester ion represented by structural formulae shown below, respectively. Among them, the perhalate ion, hexahalogenophosphate ion, tetrahalogenoborate ion, tetraaryl borate ion, sulfonate ion, sulfinate ion, carboxylate ion, halogen ion, nitrate ion, sulfate ion and sulfonimide ion are preferable, and the sulfonate ion, carboxylate ion, tetrafluoroborate ion, hexafluorophosphate ion and sulfonimide ion are more preferable.

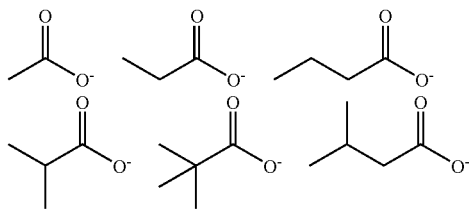

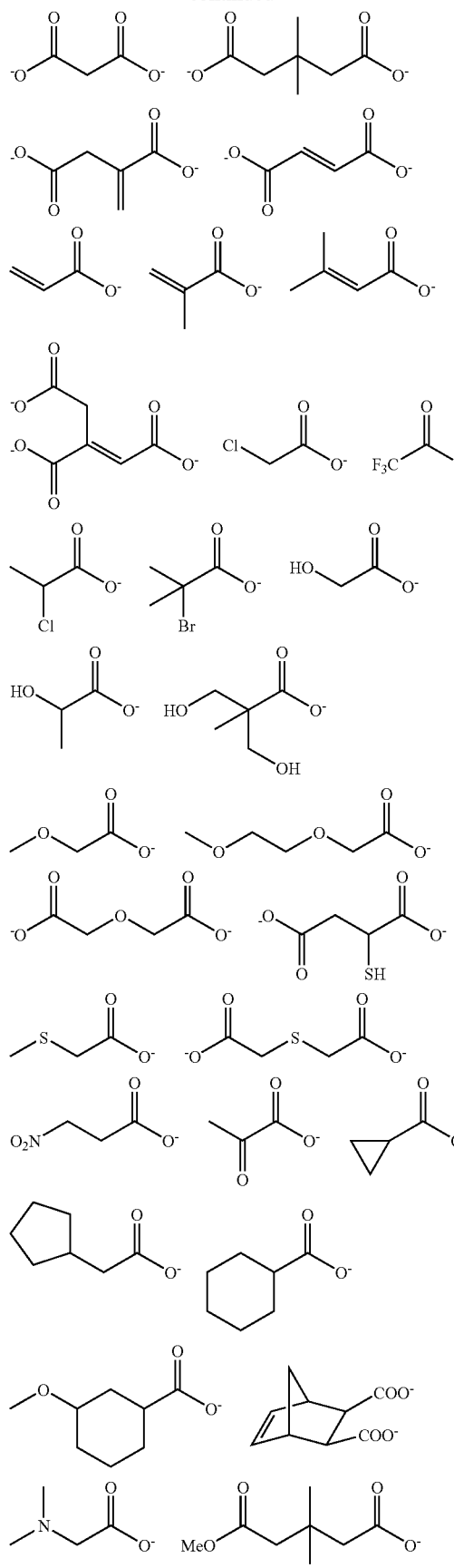
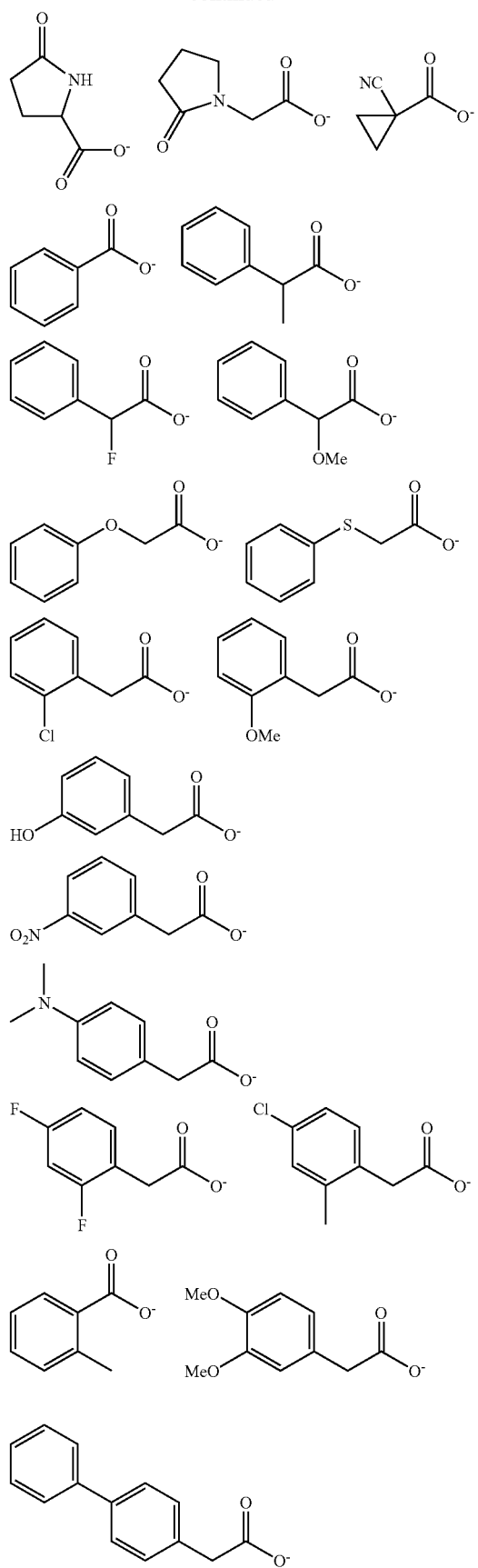

-continued
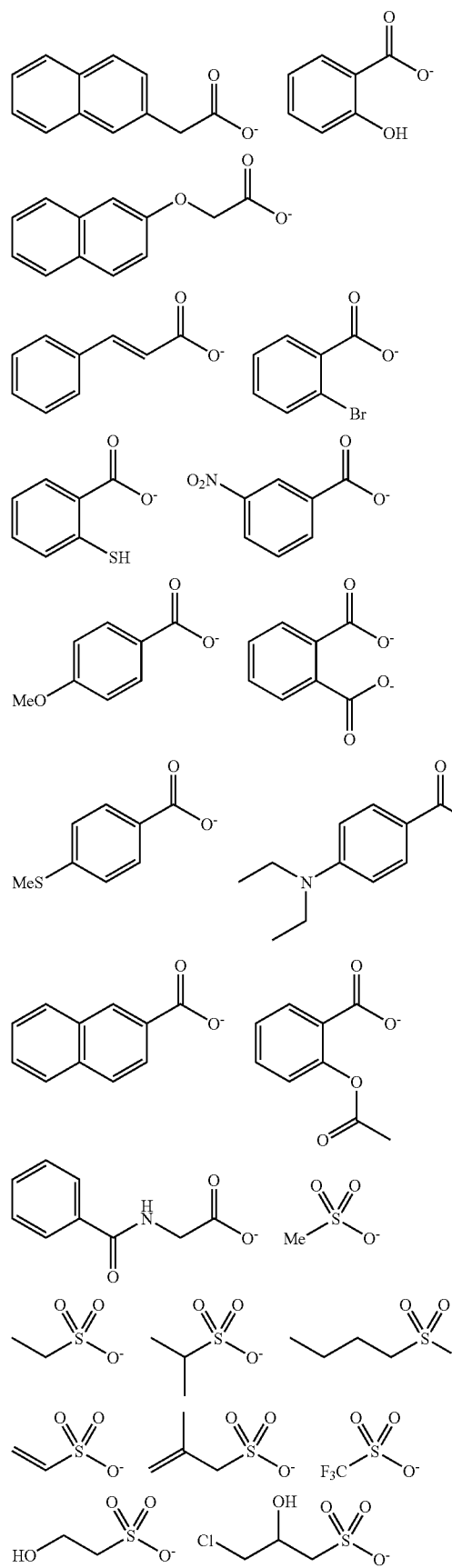
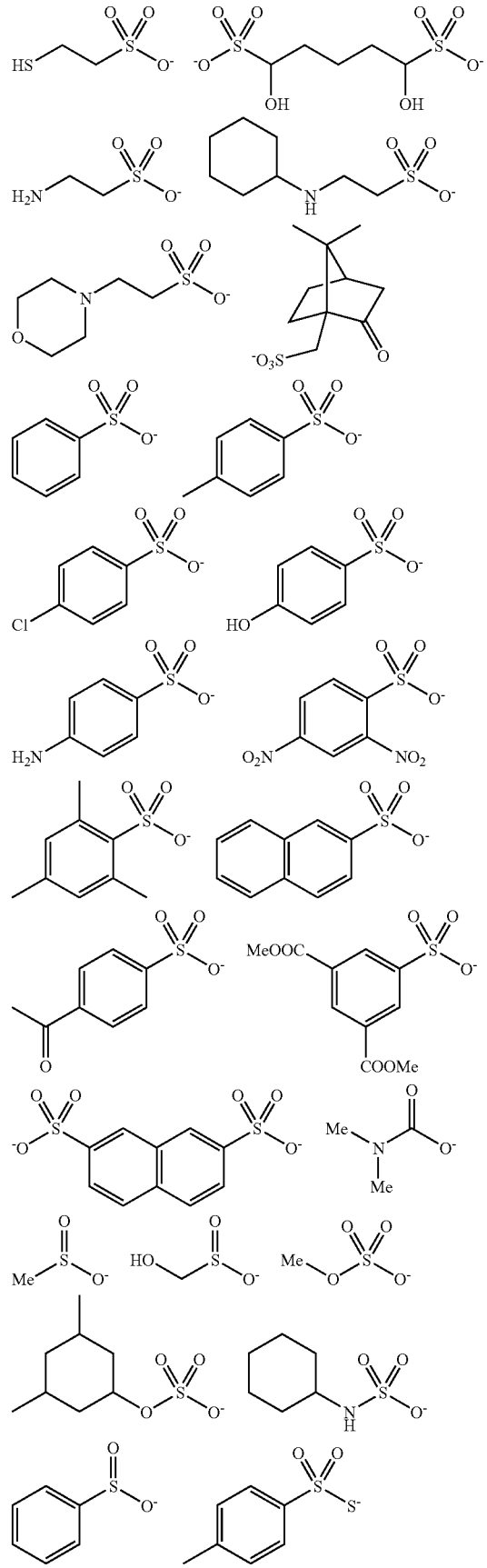

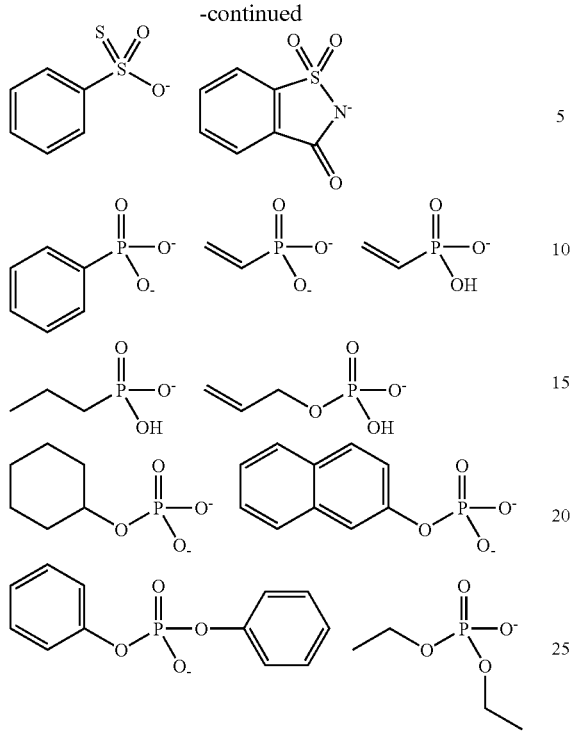

Of the functional groups represented by formulae (1) to (13), as the adsorbing group to an aluminum support or an aluminum support subjected to a silicate treatment, the functional groups represented by formulae (1) to (7) are preferable, the functional groups represented by formulae (1) to (5) are more preferable, and the functional groups represented by formulae (1) to (4) are particularly preferable.

As the adsorbing group to an aluminum support, the functional groups represented by formulae (1), (2) and (4) are particularly preferable. As the adsorbing group to an aluminum support subjected to a silicate treatment, the functional groups represented by formulae (3) and (4) are particularly preferable.

Two or more kinds of the support adsorbing groups may be present at the terminal of the main chain of the polymer compound.

As the terminal adsorbing polymer compound for use in the invention, any polymer compound having at least one support-adsorbing group as described above at a terminal of its main chain may be suitably used. A polymer compound having at least two support-adsorbing groups as described above at a terminal of its main chain is preferable and a polymer compound having at least three support-adsorbing groups as described above at a terminal of its main chain is more preferable.

[Unit (P1) Having Hydrophilic Functional Group]

The terminal adsorbing polymer compound for use in the invention preferably contains the unit (P1) having a hydrophilic functional group as a unit forming the polymer chain. As the hydrophilic functional group, any functional group which is ordinarily considered to have high affinity for water may suitably used. Specifically, functional groups represented by formulae (a1) to (a8) shown below are preferable, and the functional groups represented by formulae (a1) to (a5) are more preferable.

In formulae (a1) to (a8), M represents a hydrogen atom or a metal ion, $R_{11}$ to $R_{13}$ each represents a hydrogen atom, an alkyl group having from 1 to 6 carbon atoms or an alkenyl group having from 2 to 6 carbon atoms or appropriate two of $R_{11}$ to $R_{13}$ may be combined with each other to form a ring, $L_1$ represents an alkylene group having from 1 to 6 carbon atoms, and $X^-$ represents a counter anion.

Specific examples of the metal ion represented by M include the metal ions described above.

Specific examples of the alkyl group having from 1 to 6 carbon atoms and alkenyl group having from 2 to 6 carbon atoms represented by any one of $R_{11}$ to $R_{13}$ include the alkyl group and alkenyl group described above but having 6 or less carbon atoms, respectively.

Specific examples of the alkylene group having from 1 to 6 carbon atoms represented by $L_1$ include a methylene group, an ethylene group, a propylene group, an isopropylene group, a butylene group, an isobutylene group, a tert-butylene group, a pentylene group, a hexylene group, a cyclopropylene group, a cyclobutylene group, a cyclopentylene group and a cyclohexylene group.

Specific examples of the counter anion represented by $X^-$ include the counter anion described above.

With respect to the hydrophilic functional group, two or more different hydrophilic functional groups may be present in the same unit and two or more kinds of units having different functional groups may be contained in the polymer compound.

The content of the unit (P1) having a hydrophilic functional group is ordinarily from 0 to 100% by mole, preferably from 10 to 95% by mole, more preferably from 20 to 90% by mole, in the polymer compound.

[Unit (P2) Having Carbon-Carbon Unsaturated Double Bond]

The terminal adsorbing polymer compound for use in the invention preferably contains the unit (P2) having a carbon-carbon unsaturated double bond as a unit forming the polymer chain.

As the carbon-carbon unsaturated double bond, any carbon-carbon unsaturated double bond which generates a polymerization reaction by a radical may be suitably used and functional groups represented by formulae (c1) to (c3) shown below are particularly preferably used.

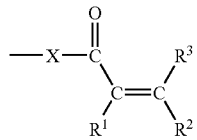
(c1)

In formula (c1), $R^1$ to $R^3$ each independently represents a hydrogen atom or a monovalent organic group.

$R_1$ preferably represents a hydrogen atom or an alkyl group which may have a substituent. Among them, a hydrogen atom, a methyl group or a —$CH_2Q$ group is more preferable because of high radical reactivity.

Q represents a halogen atom, a cyano group, an —OR14 group, an —OCOR14 group, an —OCONR14R15 group, an —OCOOR14 group, an —OSO$_2$R14 group, an —OPO(OR14)(OR15) group, an —OPOR14(OR15) group, an —NR14R15 group, an —NR14COR15 group, an —NR14COOR15 group, an —NR14CONR15R16 group, an —NR14SO$_2$R15 group, an —N(SO$_2$R14)(SO$_2$R15) group, an —N(COR14)(COR15) group, an —SR14 group, an —SOR14 group, an —SO$_2$R14 group, an —SO$_3$R14 group, —SO2NR14R15 group or a —PO(OR14)(OR15) group, and is preferably a halogen atom, a cyano group, an —OR14 group, an —OCOR14 group, an —OCONR14R15 group, an —OCOOR14 group, —NR14R15 group, an —NR14COR15 group, an —NR14COOR15 group, —NR14CONR15R16 group or —SR14.

R14 to R16 each independently represents a hydrogen atom, an alkyl group which may have a substituent, an aryl group which may have a substituent, an alkynyl group which may have a substituent or an alkenyl group which may have a substituent.

$R^2$ and $R^3$ each independently preferably represents a hydrogen atom, a halogen atom, an amino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent or an arylsulfonyl group which may have a substituent. Among them, a hydrogen atom, a carboxyl group, an alkoxycarbonyl group, an alkyl group which may have a substituent or an aryl group which may have a substituent is more preferable because of high radical reactivity.

X represents an oxygen atom, a sulfur atom or —N($R_{12}$)—, and $R_{12}$ represents a hydrogen atom or a monovalent organic group. The monovalent organic group represented by $R_{12}$ includes an alkyl group which may have a substituent. $R_{12}$ is preferably a hydrogen atom, a methyl group, an ethyl group or an isopropyl group because of high radical reactivity.

Examples of the substituent capable of being introduced include an alkyl group, an alkenyl group, an alkynyl group, an aryl group, an alkoxy group, an aryloxy group, a halogen atom, an amino group, an alkylamino group, an arylamino group, a carboxyl group, an alkoxycarbonyl group, a sulfo group, a nitro group, a cyano group, an amido group, an alkylsulfonyl group and an arylsulfonyl group.

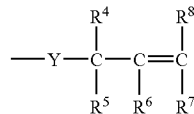
(c2)

In formula (c2), $R^4$ to $R^8$ each independently represents a hydrogen atom or a monovalent organic group.

$R^4$ to $R^8$ each independently preferably represents a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent or an arylsulfonyl group which may have a substituent. Among them, a hydrogen atom, a carboxyl group, an alkoxycarbonyl group, an alkyl group which may have a substituent or an aryl group which may have a substituent is more preferable. Examples of the substituent capable of being introduced are same as those described in formula (c1) above.

Y represents an oxygen atom, a sulfur atom or —N($R_{12}$)—, and $R_{12}$ has the same meaning as $R_{12}$ defined in formula (c1) above and preferable examples thereof are also same as those described in formula (c1) above.

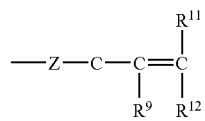
(c3)

In formula (c3), $R^9$ to $R^{11}$ each independently represents a hydrogen atom or a monovalent organic group. The monovalent organic group represented by $R^9$ includes an alkyl group which may have a substituent. $R^9$ is preferably a hydrogen atom or a methyl group because of high radical reactivity.

$R^{10}$ to $R^{11}$ each independently preferably represents a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent or an arylsulfonyl group which may have a substituent. Among them, a hydrogen atom, a carboxyl group, an alkoxycarbonyl group, an alkyl group which may have a substituent or an aryl group which may have a substituent is more preferable because of high radical reactivity. Examples of the substituent capable of being introduced are same as those described in formula (c1) above.

Z represents an oxygen atom, a sulfur atom or —N($R_{13}$)— or a phenylene group which may have a substituent and $R_{13}$ includes an alkyl group which may have a substituent and is preferably a methyl group, an ethyl group or an isopropyl group because of high radical reactivity.

Only one, two or more of the same kind or two or more different kinds of the carbon-carbon unsaturated double bonds may be present in the same unit. The polymer compound may contain two or more kinds of units having different carbon-carbon unsaturated double bonds.

The content of the unit (P2) having a carbon-carbon unsaturated double bond is ordinarily from 0 to 100% by mole, preferably from 5 to 90% by mole, more preferably from 10 to 80% by mole, in the polymer compound.

[Unit (P3) Having Hydrogen Bond-Forming Group]

The terminal adsorbing polymer compound for use in the invention preferably contains the unit (P3) having a hydrogen bond-forming group as a unit forming the polymer chain. The hydrogen bond-forming group is appropriately selected depending on the components contained in the image-forming layer and includes a hydrogen accepting group, for example, an alkylene oxide group represented by —[(CR11R12)$_n$O]$_m$—R13 (wherein R11 and R12 each independently represents a hydrogen atom, an alkyl group, an aryl group, an alkenyl group or an alkynyl group, R13 represents a hydrogen atom, an alkyl group, an aryl group, an alkenyl group, an alkynyl group, an alkylacyl group, an arylacyl group, an alkylaminoacyl group, an arylaminoacyl group, an alkylsulfone group or an arylsulfone group, and n and m each independently represents a natural number), an amino group represented by —NR11R12 (wherein R11 and R12 have the same meanings as defined above, respectively), a carbonyl group represented by —CO— or a nitrogen-containing heterocyclic group having an —N= structure, and a hydrogen donating group, for example, a carboxylic acid group represented by —COOH, a hydroxy group represented by —OH, a functional group containing a nitrogen atom having a hydrogen atom represented by —NH—, a thiol group represented by —SH, a sulfonic acid group represented by —SO$_3$H, a phosphoric acid group represented by —OPO(OR11)(OH) (wherein R11 has the same meaning as defined above) or a phosphonic acid group represented by —PO(OR11)(OH) (wherein R11 has the same meaning as defined above). Of the hydrogen bond-forming groups, the alkylene oxide group, amino group, carbonyl group, nitrogen-containing heterocyclic group having an —N= structure, carboxylic acid group, hydroxy group and functional group containing a nitrogen atom having a hydrogen atom represented by —NH— are preferable, and the alkylene oxide group, amino group, carbonyl group, carboxylic acid group, hydroxy group and functional group containing a nitrogen atom having a hydrogen atom represented by —NH— are more preferable.

Only one, two or more of the same kind or two or more different kinds of the hydrogen bond-forming groups may be present in the same unit. The polymer compound may contain two or more kinds of units having different hydrogen bond-forming groups. When two different kinds of the hydrogen bond-forming groups are used, it is preferred that two hydrogen accepting groups or two hydrogen donating groups are used together.

The content of the unit (P3) having a hydrogen bond-forming group is ordinarily from 0 to 100% by mole, preferably from 5 to 90% by mole, more preferably from 10 to 80% by mole, in the polymer compound.

Specific examples of the terminal adsorbing polymer compound for use in the invention are set forth below, but the invention should not be construed as being limited thereto.

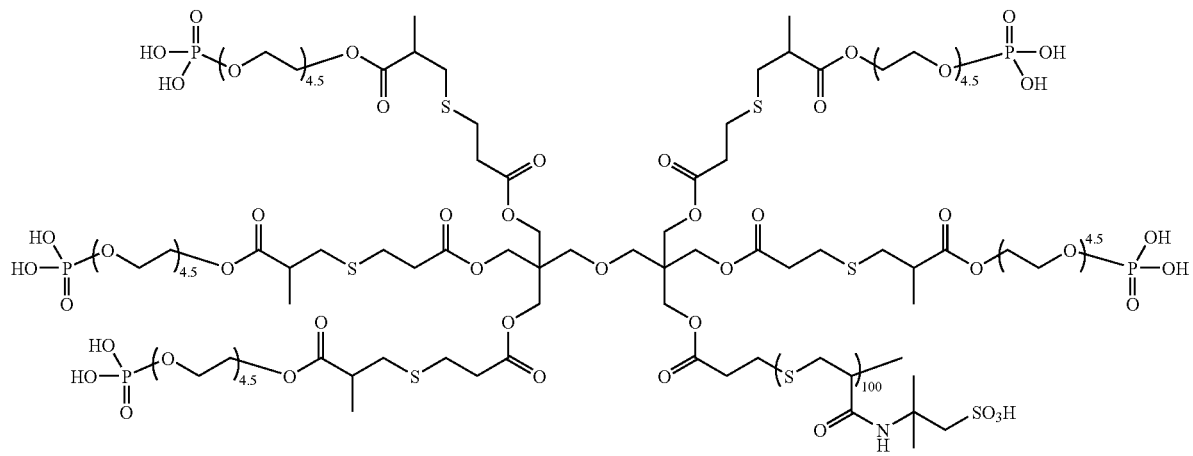

(P-1)

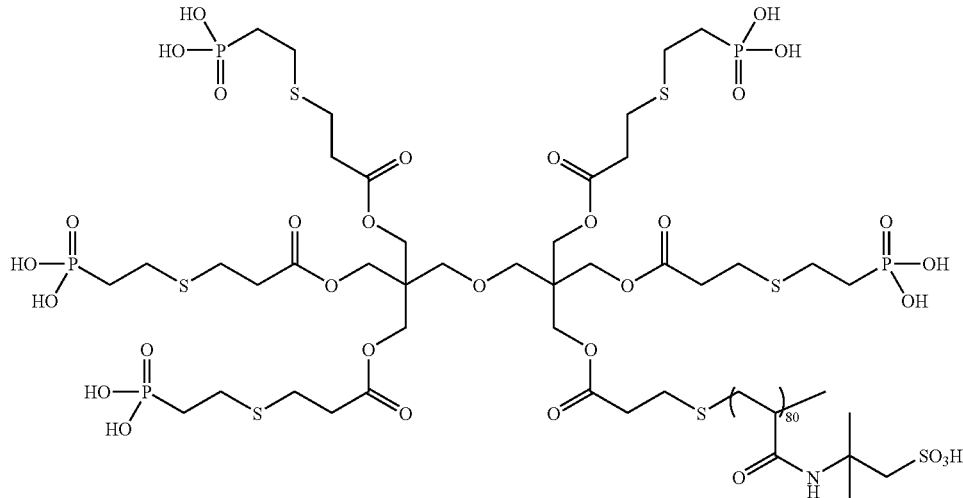

(P-2)

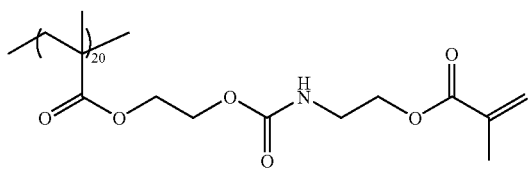
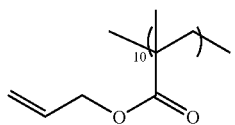
(P-3)
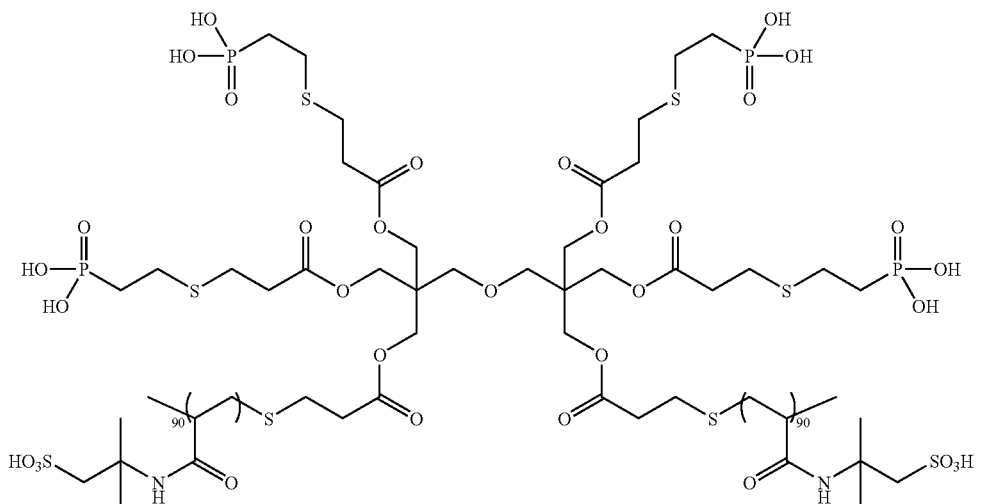
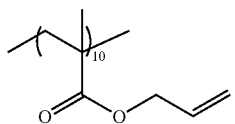
(P-4)
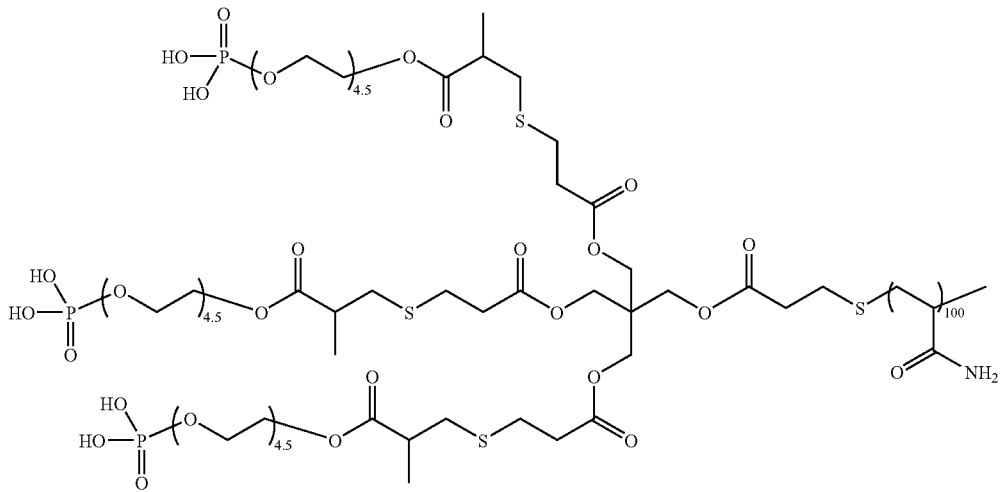

(P-5)
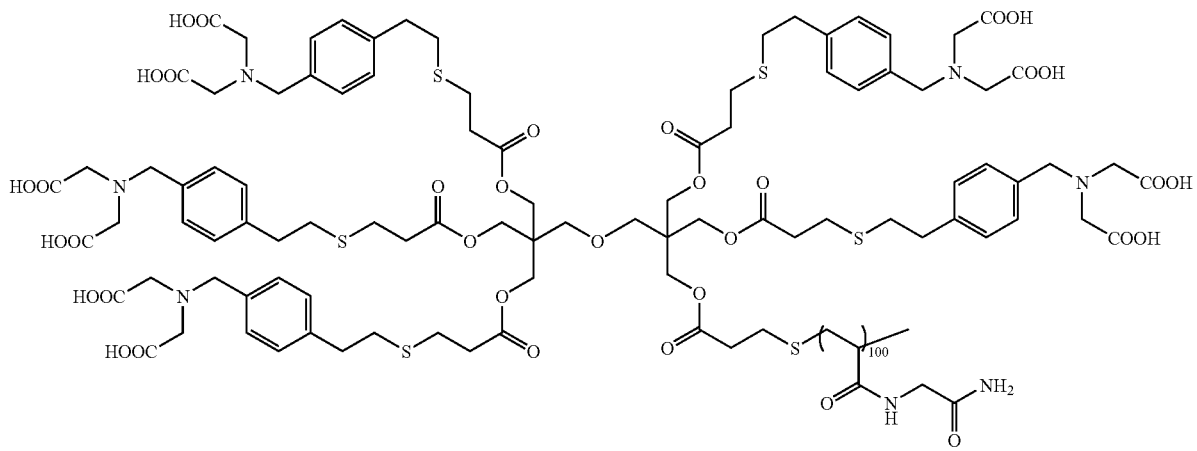
(P-6)
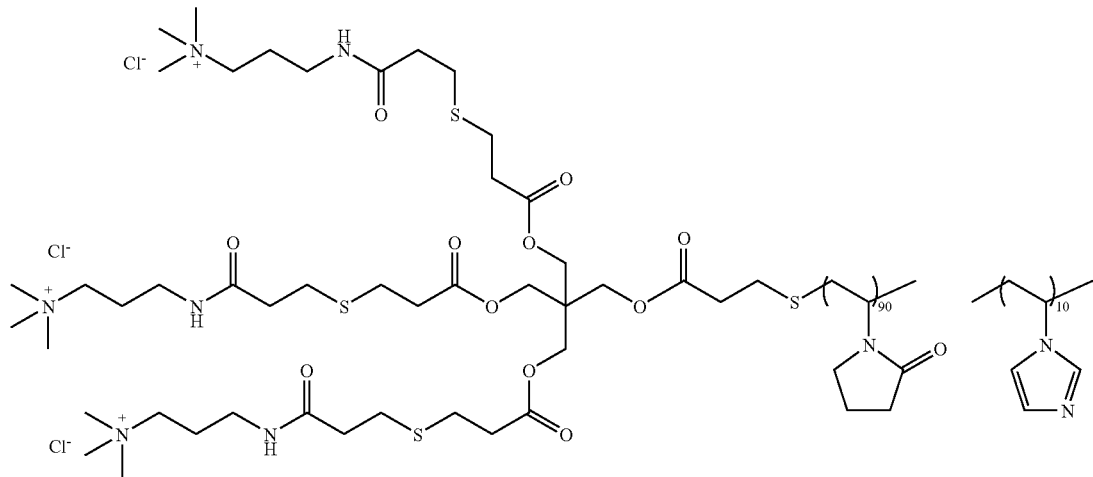
(P-7)
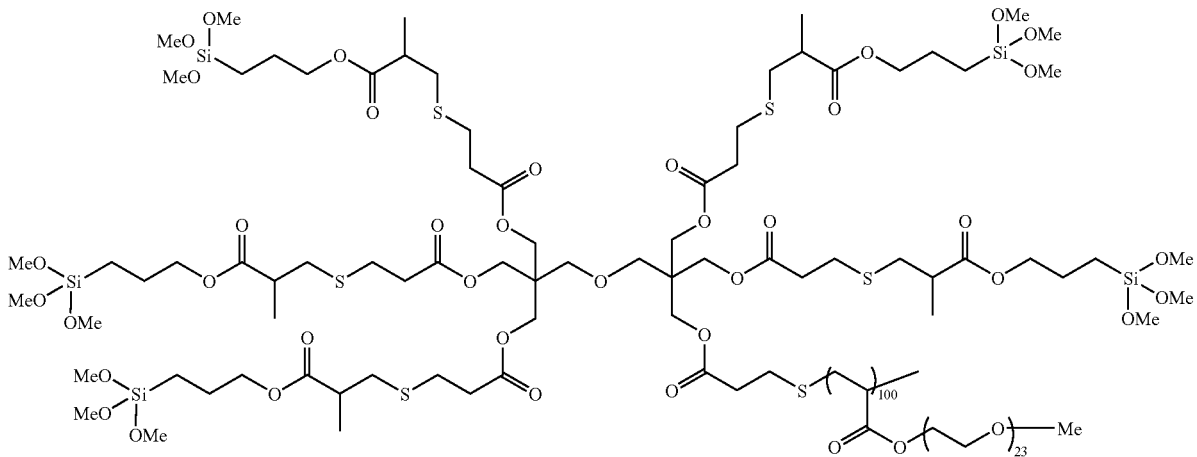

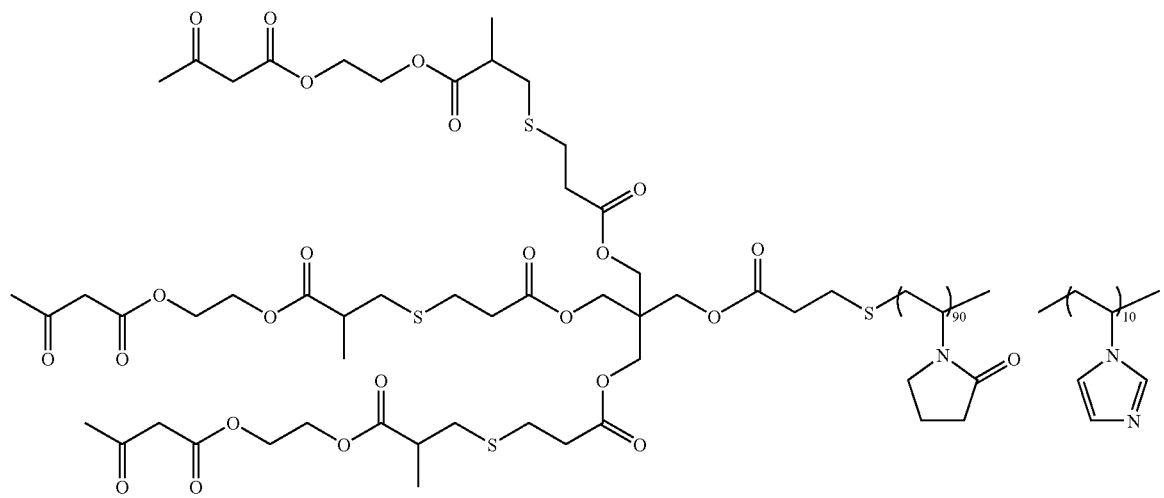
(P-8)
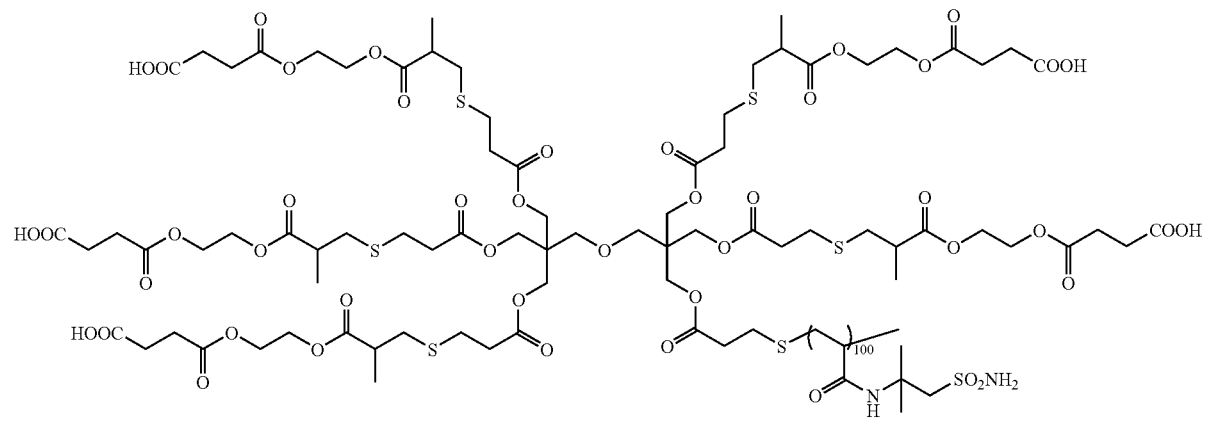
(P-9)
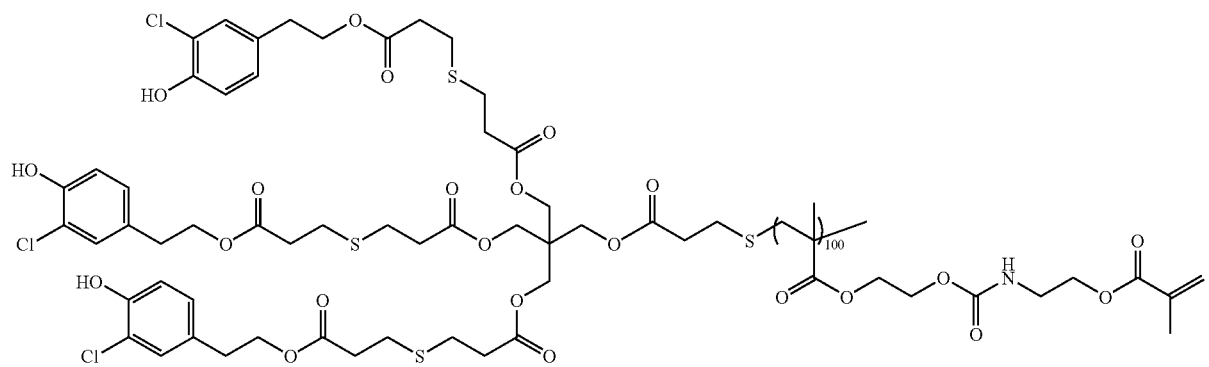
(P-10)

(P-11)

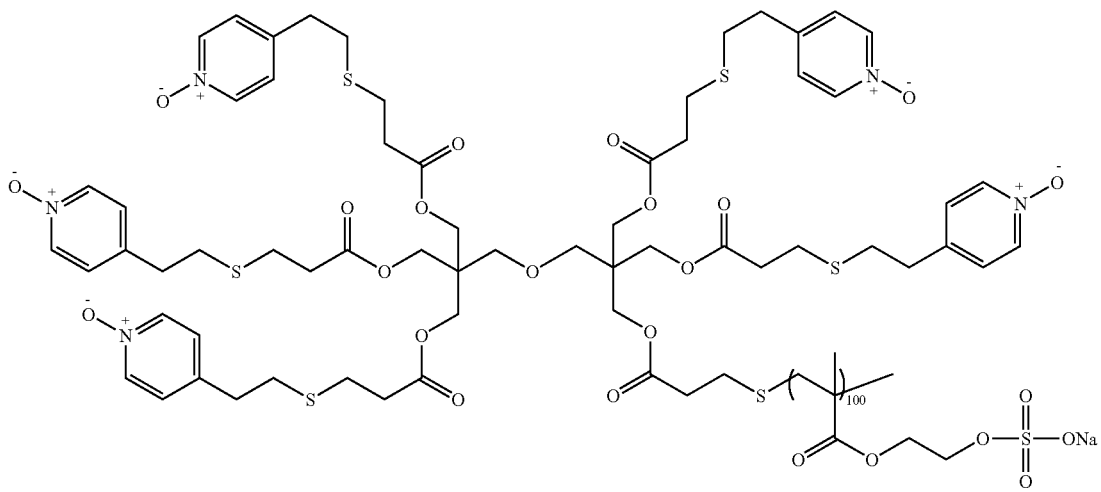

(P-12)

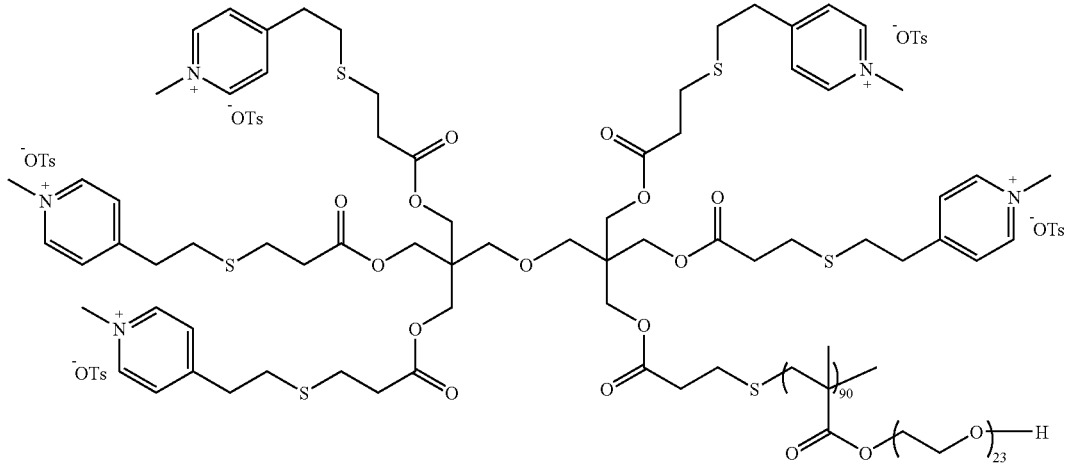

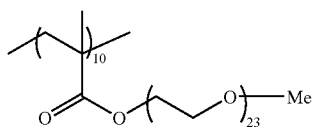

Weight average molecular weights of Compounds P-1 to P-12 illustrated above are shown below, respectively.

P-1: 10,000; P-2: 14,700; P-3: 25,000; P4: 8,000; P-5: 18,000, P-6: 6,000; P-7: 30,000, P-8: 7,000; P-9: 12,000; P-10: 10,000, P-11: 8,000; P-12: 20,000

The terminal adsorbing polymer compound for use in the invention can be synthesized by (1) a method of polymerization using a chain transfer agent having the support-adsorbing group, (2) a method of polymerization using a chain transfer agent having a reactive functional group and then reacting the reactive functional group with a compound having the support-adsorbing group and a functional group which can react with the reactive functional group, and (3) a method of polymerization using a chain transfer agent having a reactive functional group and then changing the reactive functional group to the support-adsorbing group. In view of easiness in the synthesis method, it is preferred to use the method (1).

Preparation examples of the terminal adsorbing polymer compound for use in the invention are set forth below, but the invention should not be construed as being limited thereto.

<Preparation of Terminal Adsorbing Polymer Compound P-1>

In 500-ml tree-necked flask were put 23.28 g of Phosmer PE (produced by Uni-Chemical Co., Ltd.), 10.01 g of dipentaerythritol hexakis(3-mercaptopropionate) and 133.16 g of N-methyl-2-pyrrolidinone and the mixture was stirred in a nitrogen stream at 74° C. for 30 minutes. To the mixture was added a mixed solution of 0.147 g of dimethyl 2,2'-azobisisobutyrate and 1.0 g of N-methyl-2-pyrrolidinone and the mixture was stirred in a nitrogen stream at 74° C. for 3 hours. After 3 hours, the reaction mixture was cooled to room temperature and 48.93 g of 2-acrylamido-2-methylpropanesulfonic acid and 129.12 g of N-methyl-2-pyrrolidinone were added thereto, followed by stirring in a nitrogen stream at 74° C. To the mixture was added a mixed solution of 0.190 g of dimethyl 2,2'-azobisisobutyrate and 1.0 g of N-methyl-2-pyrrolidinone, followed by stirring in a nitrogen stream at 74° C. for 2 hours and then was further added a mixed solution of 0.095 g of dimethyl 2,2'-azobisisobutyrate and 0.5 g of N-methyl-2-pyrrolidinone, followed by stirring in a nitrogen stream at 74° C. for 2 hours. The temperature of the reaction mixture was raised to 85° C., stirred for one and a half hours as it was and then cooled to room temperature to obtain an N-methyl-2-pyrrolidinone solution of Terminal adsorbing polymer compound P-1 (solid content concentration of 24% by weight).

<Preparation of Terminal Adsorbing Polymer Compound P-2>

(Preparation of Chain Transfer Agent P-2A Having Support-Adsorbing Group)

In 200-ml tree-necked flask were put 7.83 g of dipentaerythritol hexakis(3-mercaptopropionate), 5.40 g of vinylphosphonic acid and 52.92 g of N-methyl-2-pyrrolidinone and the mixture was stirred in a nitrogen stream at 70° C. To the mixture was added 0.023 g of dimethyl 2,2'-azobisisobutyrate and the mixture was stirred in a nitrogen stream at 70° C. for 4 hours. After 4 hours, the disappearance of vinyl protons of the vinylphosphonic acid was confirmed by 1H-NMR and then the mixture was cooled to room temperature to prepare Chain transfer agent P-2A having a support-adsorbing group. (Preparation of Terminal adsorbing polymer compound P-2B)

In a 100-ml three-necked flask were put 4.97 g of 2-acrylamido-2-methylpropanesulfonic acid, 1.57 g of Blenmer PE200 (produced by Takemoto Oil and Fat Co., Ltd.), 19.85 g of P-2A described above and 7.33 g of N-methyl-2-pyrrolidinone and the mixture was stirred in a nitrogen stream at 74° C. for 30 minutes. After 30 minutes, a mixed solution of 0.024 g of dimethyl 2,2'-azobisisobutyrate and 0.93 g of N-methyl-2-pyrrolidinone was added thereto, followed by stirring as it was for 2 hours. After 2 hours, a mixed solution of 0.012 g of dimethyl 2,2'-azobisisobutyrate and 0.93 g of N-methyl-2-pyrrolidinone was further added thereto, followed by stirring in a nitrogen stream at 74° C. for 2 hours and then 85° C. for one and a half hours. The resulting reaction mixture was cooled to room temperature to obtain Terminal adsorbing polymer compound P-2B (solid content concentration of 29.6% by weight). A weight average molecular weight of Terminal adsorbing polymer compound P-2B obtained was 9,800.

(Preparation of Terminal Adsorbing Polymer Compound P-2C)

Terminal adsorbing polymer compound P-2C (solid content concentration of 26.2% by weight) was obtained in the same manner as in the preparation of Terminal adsorbing polymer compound P-2B except for changing the amount of P-2A added to 9.93 g. A weight average molecular weight of Terminal adsorbing polymer compound P-2C obtained was 14,700.

(Preparation of Terminal Adsorbing Polymer Compound P-2D)

Terminal adsorbing polymer compound P-2D (solid content concentration of 23.0% by weight) was obtained in the same manner as in the preparation of Terminal adsorbing polymer compound P-2B except for changing the amount of P-2A added to 1.99 g. A weight average molecular weight of Terminal adsorbing polymer compound P-2D obtained was 32,300.

(Preparation of Terminal Adsorbing Polymer Compound P-2)

In a 100-ml three-necked flask were put 30 g of Terminal adsorbing polymer compound P-2B, 0.039 g of p-benzoquinone, 4.29 g of Karenz MOI (produced by Showa Denko K. K.) and 22.25 g of N-methyl-2-pyrrolidinone and the mixture was begun to stir at room temperature. To the solution was added a mixed solution of 0.157 g of Neostan U-600 (produced by Nitto Chemical Industry Co., Ltd.) and 0.5 g of N-methyl-2-pyrrolidinone and the temperature of the mixture was raised to 55° C., followed by stirring for 6 hours. After 6 hours, 2.66 g of methanol was added thereto, followed by further stirring for 2 hours. The resulting reaction mixture was cooled to room temperature to obtain Terminal adsorbing polymer compound P-2 (solid content concentration of 17% by weight) having a weight average molecular weight of 9,800.

In the same manner as above, Terminal adsorbing polymer compound P-2 (solid content concentration of 17% by weight) having a weight average molecular weight of 14,700 and Terminal adsorbing polymer compound P-2 (solid content concentration of 17% by weight) having a weight average molecular weight of 32,300 were obtained from Terminal adsorbing polymer compound P-2C and Terminal adsorbing polymer compound P-2D, respectively.

The terminal adsorbing polymer compound for use in the invention preferably has a weight average molecular weight of 1,000 to 500,000, more preferably from 5,000 to 250,000, and particularly preferably from 10,000 to 100,000.

The terminal adsorbing polymer compounds for use in the invention may be used individually or as a mixture of two or more thereof.

The terminal adsorbing polymer compound for use in the invention may form a layer individually or together with compounds described hereinafter. The content of the terminal adsorbing polymer compound in a layer containing the terminal adsorbing polymer compound is preferably from 1 to 100% by weight, more preferably from 5 to 100% by weight, and particularly preferably from 10 to 100% by weight.

<Other Components>

The layer containing the terminal adsorbing polymer compound for use in the lithographic printing plate precursor according to the invention may contain a polymer compound other than the terminal adsorbing polymer compound, a binder polymer, a radical polymerizable compound, a surfactant, a polymerization inhibitor, an initiator, a sensitizing dye, a co-initiator, a coloring agent and the like. As the binder polymer, radical polymerizable compound, surfactant, polymerization inhibitor, initiator, sensitizing dye, co-initiator and coloring agent, those described for the image-forming layer hereinafter can be used.

The layer containing the terminal adsorbing polymer compound for use in the lithographic printing plate precursor according to the invention may be the image-forming layer or an undercoat layer provided between the image-forming layer and support and it is preferably the undercoat layer.

The constituting components of the image-forming layer for use in the lithographic printing plate precursor according to the invention will be described below.

<Sensitizing Dye>

The image-forming layer according to the invention contains a sensitizing dye. For example, by added a sensitizing dye having an absorption maximum in a wavelength range of 350 to 450 nm, a sensitizing dye having an absorption maximum in a wavelength range of 500 to 600 and an infrared absorbing agent having an absorption maximum in a wavelength range of 750 to 1,400 nm to the image-forming layer, high-sensitive lithographic printing plate precursors responding to a violet laser of 405 nm, green laser of 532 nm and IR laser of 803 nm ordinarily used in the industry can be provided, respectively.

First, the sensitizing dye having an absorption maximum in a wavelength range of 350 to 450 nm is described below. Such sensitizing dyes include, for example, merocyanine dyes, benzopyranes, coumarins, aromatic ketones and anthracenes.

Of the sensitizing dyes having an absorption maximum in a wavelength range of 350 to 450 nm, dyes represented by formula (IX) shown below are more preferable in view of high sensitivity.

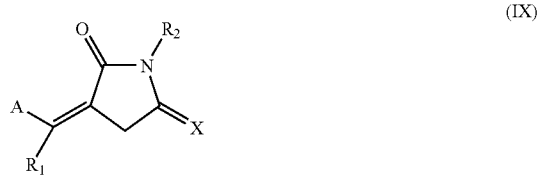

In formula (IX), A represents an aromatic cyclic group which may have a substituent or a heterocyclic group which may have a substituent, X represents an oxygen atom, a sulfur atom or $=N(R_3)$, and $R_1$, $R_2$ and $R_3$ each independently represents a monovalent non-metallic atomic group, or A and $R_1$ or $R_2$ and $R_3$ may be combined with each other to form an aliphatic or aromatic ring.

The formula (IX) will be described in more detail below. $R_1$, $R_2$ and $R_3$ each independently represents a monovalent non-metallic atomic group, preferably a substituted or unsubstituted alkyl group, a substituted or unsubstituted alkenyl group, a substituted or unsubstituted aryl group, a substituted or unsubstituted aromatic heterocyclic residue, a substituted or unsubstituted alkoxy group, a substituted or unsubstituted alkylthio group, a hydroxy group or a halogen atom.

Next, A in formula (IX) is described below. A represents an aromatic cyclic group which may have a substituent or heterocyclic group which may have a substituent. Specific examples of the aromatic cyclic group which may have a substituent and heterocyclic group which may have a substituent include those described for the aryl group and aromatic heterocyclic residue in any one of $R_1$, $R_2$ and $R_3$ in formula (IX).

As specific examples of the sensitizing dye, compounds described in Paragraph Nos. [0047] to [0053] of JP-A-2007-58170 are preferably used.

Sensitizing dyes described in JP-A-2007-171406, JP-A-2007-206216, JP-A-2007-206217, JP-A-2007-225701, JP-A-2007-225702, JP-A-2007-316582 and JP-A-2007-328243 are also preferably used.

The amount of the sensitizing dye added is preferably from 0.05 to 30 parts by weight, more preferably from 0.1 to 20 parts by weight, most preferably from 0.2 to 10 parts by weight, per 100 parts by weight of the total solid content of the image-forming layer.

The sensitizing dye having an absorption maximum in a wavelength range of 750 to 1,400 preferably used in the invention is described in detail below.

It is believed that the sensitizing dye used forms an electron excited state with high sensitivity upon irradiation (exposure) of infrared laser, and electron transfer, energy transfer or heat generation (light-to-heat conversion function) relating to the electron excited state acts on a polymerization initiator coexistent in the image-forming layer to cause chemical change in the polymerization initiator, thereby generating a radical. In any event, it is particularly preferable for plate making including direct drawing with the infrared laser having a wavelength of 750 to 1,400 nm to add the sensitizing dye having an absorption maximum in a wavelength range of 750 to 1,400 and the high image-forming property can be generated in comparison with a conventional lithographic printing plate precursor.

The infrared absorbing agent is preferably a dye or pigment having an absorption maximum in a wavelength range of 750 to 1,400 nm.

As the dye, commercially available dyes and known dyes described in literatures, for example, *Senryo Binran* (*Dye Handbook*) compiled by The Society of Synthetic Organic Chemistry, Japan (1970) can be used. Specifically, the dyes includes azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal thiolate complexes.

Of the dyes, cyanine dyes, squarylium dyes, pyrylium dyes, nickel thiolate complexes and indolenine cyanine dyes are particularly preferred. Further, cyanine dyes and indolenine cyanine dyes are more preferred. As particularly preferable examples of the dye, cyanine dyes represented by formula (a) shown below are exemplified.

Formula (a)

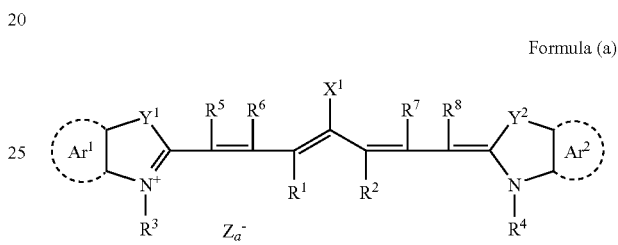

In formula (I), $X^1$ represents a hydrogen atom, a halogen atom, $—NPh_2$, $X^2-L^1$ or a group shown below. $X^2$ represents an oxygen atom, a nitrogen atom or a sulfur atom, $L^1$ represents a hydrocarbon group having from 1 to 12 carbon atoms, an aromatic cyclic group containing a hetero atom or a hydrocarbon group having from 1 to 12 carbon atoms and containing a hetero atom. The hetero atom indicates herein a nitrogen atom, a sulfur atom, an oxygen atom, a halogen atom or a selenium atom. $Xa^-$ has the same meaning as $Za^-$ defined hereinafter. $R^a$ represents a hydrogen atom or a substituent selected from an alkyl group, an aryl group, a substituted or unsubstituted amino group and a halogen atom.

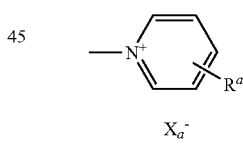

$R^1$ and $R^2$ each independently represents a hydrocarbon group having from 1 to 12 carbon atoms. In view of the preservation stability of a coating solution for image-forming layer, it is preferred that $R^1$ and $R^2$ each represents a hydrocarbon group having two or more carbon atoms, and it is particularly preferred that $R^1$ and $R^2$ are combined with each other to form a 5-membered or 6-membered ring.

$Ar^1$ and $Ar^2$, which may be the same or different, each represents an aromatic hydrocarbon group which may have a substituent. Preferable examples of the aromatic hydrocarbon group include a benzene ring group and a naphthalene ring group. Preferable examples of the substituent include a hydrocarbon group having 12 or less carbon atoms, a halogen atom and an alkoxy group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms, which may have a substituent. Preferable examples of the substituent include an alkoxy group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms. In view of the availability of raw materials, a hydrogen atom is preferred. $Za^-$ represents a counter anion. However, $Za^-$ is not necessary when the cyanine dye represented by formula (a) has an anionic substituent in the structure thereof and neutralization of charge is not needed. Preferable examples of the counter ion for $Za^-$ include a halogen ion, a perchlorate ion, a tetrafluoroborate ion, a hexafluorophosphate ion and a sulfonate ion, and particularly preferable examples thereof include a perchlorate ion, a hexafluorophosphate ion and an arylsulfonate ion in view of the preservation stability of a coating solution for image-forming layer. As the counter ion, that not containing a halogen ion is particularly preferable.

Specific examples of the cyanine dye represented by formula (a), which can be preferably used in the invention, include those described in Paragraph Nos. [0017] to [0019] of JP-A-2001-133969.

Further, other particularly preferable examples include specific indolenine cyanine dyes described in JP-A-2002-278057.

Examples of the pigment for use in the invention include commercially available pigments and pigments described in *Colour Index (C.I.)*, *Saishin Ganryo Binran (Handbook of the Newest Pigments)* compiled by Pigment Technology Society of Japan (1977), *Saishin Ganryo Oyou Gijutsu (Newest Application on Technologies for Pigments)*, CMC Publishing Co., Ltd. (1986) and *Insatsu Ink Gijutsu (Printing Ink Technology)*, CMC Publishing Co., Ltd. (1984).

Examples of the pigment include black pigments, yellow pigments, orange pigments, brown pigments, red pigments, purple pigments, blue pigments, green pigments, fluorescent pigments, metal powder pigments and polymer-bonded dyes. Specific examples of usable pigment include insoluble azo pigments, azo lake pigments, condensed azo pigments, chelated azo pigments, phthalocyanine pigments, anthraquinone pigments, perylene and perynone pigments, thioindigo pigments, quinacridone pigments, dioxazine pigments, isoindolinone pigments, quinophthalone pigments, dying lake pigments, azine pigments, nitroso pigments, nitro pigments, natural pigments, fluorescent pigments, inorganic pigments and carbon black. Of the pigments, carbon black is preferred.

The pigment may be used without undergoing surface treatment or may be used after the surface treatment. For the surface treatment, a method of coating a resin or wax on the surface, a method of attaching a surfactant and a method of bonding a reactive substance (for example, a silane coupling agent, an epoxy compound or polyisocyanate) to the pigment surface. The surface treatment methods are described in *Kinzoku Sekken no Seishitsu to Oyo (Properties and Applications of Metal Soap)*, Saiwai Shobo, *Insatsu Ink Gijutsu (Printing Ink Technology)*, CMC Publishing Co., Ltd. (1984) and *Saishin Ganryo Oyo Gijutsu (Newest Application on Technologies for Pigments)*, CMC Publishing Co., Ltd. (1986).

The pigment has a particle size of preferably from 0.01 to 10 µm, more preferably from 0.05 to 1 µm, and particularly preferably from 0.1 to 1 µm. In the range described above, excellent dispersion stability of the pigment in the image-forming layer is achieved and a uniform image-forming layer can be obtained.

For dispersing the pigment, known dispersion techniques for use in the production of ink or toner may be used. Examples of the dispersing machine include an ultrasonic dispersing machine, a sand mill, an attritor, a pearl mill, a super-mill, a ball mill, an impeller, a disperser, a KD mill, a colloid mill, a dynatron, a three roll mill and a pressure kneader. The dispersing machines are described in detail in *Saishin Ganryo Oyo Gijutsu (Newest Application on Technologies for Pigments)*, CMC Publishing Co., Ltd. (1986).

The infrared absorbing agent may be added together with other components to the same layer or a different layer separately provided.

The infrared absorbing agent is added ordinarily in an amount of 0.01 to 50% by weight, preferably in an amount of 0.1 to 10% by weight, particularly preferably in an amount of 0.5 to 10% by weight in case of the dye and in an amount of 0.1 to 10% by weight in case of the pigment, based on the total solid content constituting the image-forming layer, from the standpoint of uniformity in the image-forming layer and durability of the image-forming layer.

<Polymerization Initiator>

The image-forming layer according to the invention contains a polymerization initiator (hereinafter, also referred to as an initiator compound). The initiator compound is a compound undergoing chemical change upon a function, for example, electron transfer, energy transfer or heat generation resulting from the sensitizing dye in the electron excited state to generate at least one species selected from a radical, an acid or a base. The radical, acid or base thus-generated is simply referred to as an active species, hereinafter. When the initiator compound is not present or when it is used alone, sensitivity sufficient for practical use can not be obtained. According to one embodiment of using the sensitizing dye together with the initiator compound, it is possible to utilize a single compound including both compounds prepared by an appropriate chemical method (for example, a linkage of the sensitizing dye and the initiator compound by a chemical bond).

It is believed that many of the initiator compounds ordinarily generate the active species through an initial chemical process as typified by following processes (1) to (3). Specifically, there are a process (1): reductive decomposition of the initiator compound based on electron transfer from the sensitizing dye in the electron excited state to the initiator compound, a process (2): oxidative decomposition of the initiator compound based on electron transfer from the initiator compound to the sensitizing dye in the electron excited state, and a process (3): decomposition of the initiator compound in the electron excited state based on energy transfer from the sensitizing dye in the electron excited state to the initiator compound. Although it is unclear in many cases that an individual initiator compound decomposes according to which process belongs to (1) to (3), in the invention the sensitizing dye has a great feature in that it exhibits a very large sensitizing effect even in combination with any initiator compounds decomposed according to the processes (1) to (3).

As the initiator compound according to the invention, initiator compounds known to those skilled in the art can be used without limitation. Specifically, the initiator compound includes, for example, a trihalomethyl compound, a carbonyl compound, an organic peroxide, an azo compound, an azide compound, a metallocene compound, a hexaarylbiimidazole compound, an organic boron compound, a disulfone compound, an oxime ester compound, an onium salt compound and a iron arene complex. Among them, at least one compound selected from the hexaarylbiimidazole compound, onium salt compound, trihalomethyl compound and metallocene compound is preferable, and the hexaarylbiimidazole compound and onium salt compound are particularly preferable. The polymerization initiators may be appropriately used in combination of two or more thereof.

The hexaarylbiimidazole polymerization initiator includes, for example, lophine dimers described in JP-B45-37377 and JP-B-44-86516, specifically, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluoromethylphenyl)-4,4',5,5'-tetraphenylbiimidazole.

According to the invention, the onium salt is preferably used as the radical polymerization initiator. In particular, it is preferred to use in combination with an infrared absorbing agent, as the sensitizer. The onium salt preferably used in the invention includes onium salts represented by the following formulae (RI-I) to (RI-III):

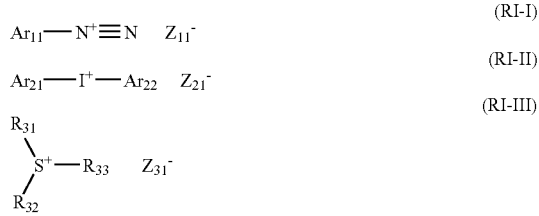

In formula (RI-I), $Ar_{11}$ represents an aryl group having 20 or less carbon atoms, which may have 1 to 6 substituents. Preferable examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido group or arylamido having from 1 to 12 carbon atoms, a carbonyl group, a carboxyl group, a cyano group, a sulfonyl group, an thioalkyl group having from 1 to 12 carbon atoms and an thioaryl group having from 1 to 12 carbon atoms. $Z_{11}^-$ represents a monovalent anion. Specific examples of the monovalent anion include a halogen ion, a perchlorate ion, a hexafluorophosphate ion, a tetrafluoroborate ion, a sulfonate ion, a sulfinate ion, a thiosulfonate ion and a sulfate ion. Among them, a perchlorate ion, a hexafluorophosphate ion, a tetrafluoroborate ion, a sulfonate ion and a sulfinate ion are preferred in view of stability.

In the formula (RI-II), $Ar_{21}$ and $Ar_{22}$ each independently represents an aryl group having 20 or less carbon atoms, which may have 1 to 6 substituents. Preferable examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido group or arylamido group having from 1 to 12 carbon atoms, a carbonyl group, a carboxyl group, a cyano group, a sulfonyl group, an thioalkyl group having from 1 to 12 carbon atoms and an thioaryl group having from 1 to 12 carbon atoms. $Z_{21}^-$ represents a monovalent anion. Specific examples of the monovalent anion include a halogen ion, a perchlorate ion, a hexafluorophosphate ion, a tetrafluoroborate ion, a sulfonate ion, a sulfinate ion, a thiosulfonate ion, a sulfate ion and a carboxylate ion. Among them, a perchlorate ion, a hexafluorophosphate ion, a tetrafluoroborate ion, a sulfonate ion, a sulfinate ion and a carboxylate ion are preferred in view of stability and reactivity.

In the formula (RI-III), $R_{31}$, $R_{32}$ and $R_{33}$ each independently represents an aryl group having 20 or less carbon atoms, which may have 1 to 6 substituents, an alkyl group, an alkenyl group or an alkynyl group. Among them, the aryl group is preferred in view of reactivity and stability. Preferable examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido group or arylamido group having from 1 to 12 carbon atoms, a carbonyl group, a carboxyl group, a cyano group, a sulfonyl group, an thioalkyl group having from 1 to 12 carbon atoms and an thioaryl group having from 1 to 12 carbon atoms. $Z_{31}^-$ represents a monovalent anion. Specific examples of the monovalent anion include a halogen ion, a perchlorate ion, a hexafluorophosphate ion, a tetrafluoroborate ion, a sulfonate ion, a sulfinate ion, a thiosulfonate ion, a sulfate ion and a carboxylate ion. Among them, a perchlorate ion, a hexafluorophosphate ion, a tetrafluoroborate ion, a sulfonate ion, a sulfinate ion and a carboxylate ion are preferred in view of stability and reactivity. Carboxylate ions described in JP-A-2001-343742 are more preferable, and carboxylate ions described in JP-A-2002-148790 are particularly preferable.

Specific examples of the onium salt include compounds described in Paragraph Nos. [0183] to [0188] of JP-A-2006-137100.

As other polymerization initiators, polymerization initiators described in JP-A-2007-171406, JP-A-2007-206216, JP-A-2007-206217, JP-A-2007-225701, JP-A-2007-225702, JP-A-2007-316582 and JP-A-2007-328243 are preferably used.

The polymerization initiators are preferably used individually or in combination of two or more thereof according to the invention.

The amount of the polymerization initiator used in the image-forming layer according to the invention is preferably from 0.01 to 20% by weight, more preferably from 0.1 to 15% by weight, still more preferably from 1.0 to 10% by weight, based on the total solid content of the image-forming layer.

<Radical Polymerizable Compound>

The polymerizable compound for use in the image-forming layer according to the invention is an addition-polymerizable compound having at least one ethylenically unsaturated double bond, and it is selected from compounds having at least one, preferably two or more, terminal ethylenically unsaturated double bonds. Such compounds are widely known in the art and they can be used in the invention without any particular limitation. The compound has a chemical form, for example, a monomer, a prepolymer, specifically, a dimer, a trimer or an oligomer, or a copolymer thereof, or a mixture thereof Examples of the monomer include unsaturated carboxylic acids (for example, acrylic acid, methacrylic acid, itaconic acid, crotonic acid, isocrotonic acid or maleic acid)

and esters or amides thereof. Preferably, esters of an unsaturated carboxylic acid with an aliphatic polyhydric alcohol compound and amides of an unsaturated carboxylic acid with an aliphatic polyvalent amine compound are used. An addition reaction product of an unsaturated carboxylic acid ester or amide having a nucleophilic substituent, for example, a hydroxy group, an amino group or a mercapto group, with a monofunctional or polyfunctional isocyanate or epoxy compound, or a dehydration condensation reaction product of the unsaturated carboxylic acid ester or amide with a monofunctional or polyfunctional carboxylic acid is also preferably used. Moreover, an addition reaction product of an unsaturated carboxylic acid ester or amide having an electrophilic substituent, for example, an isocyanate group or an epoxy group with a monofunctional or polyfunctional alcohol, amine or thiol, or a substitution reaction product of an unsaturated carboxylic acid ester or amide having a releasable substituent, for example, a halogen atom or a tosyloxy group with a monofunctional or polyfunctional alcohol, amine or thiol is also preferably used. In addition, compounds in which the unsaturated carboxylic acid described above is replaced by an unsaturated phosphonic acid, styrene, vinyl ether or the like can also be used.

Specific examples of the monomer, which is an ester of an aliphatic polyhydric alcohol compound with an unsaturated carboxylic acid, include, as an acrylic acid ester, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, isocyanuric acid ethylene oxide (EO) modified triacrylate and polyester acrylate oligomer.

As a methacrylic acid ester, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane and bis[p-(methacryloxyethoxy)phenyl]dimethylmethane are exemplified.

As an itaconic acid ester, for example, ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate are exemplified. As a crotonic acid ester, for example, ethylene glycol dicrotonate, tetramethylene glycol dicrotonate, pentaerythritol dicrotonate and sorbitol tetracrotonate are exemplified. As an isocrotonic acid ester, for example, ethylene glycol diisocrotonate, pentaerythritol diisocrotonate and sorbitol tetraisocrotonate are exemplified. As a maleic acid ester, for example, ethylene glycol dimaleate, triethylene glycol dimaleate, pentaerythritol dimaleate and sorbitol tetramaleate are exemplified.

Other examples of the ester, which can be preferably used, include aliphatic alcohol esters described in JP-B-51-47334 and JP-A-57-196231, esters having an aromatic skeleton described in JP-A-59-5240, JP-A-59-5241 and JP-A-2-226149, and esters containing an amino group described in JP-A-1-165613.

The above-described ester monomers can also be used as a mixture.

Specific examples of the monomer, which is an amide of an aliphatic polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide. Other preferable examples of the amide monomer include amides having a cyclohexylene structure described in JP-B-54-21726.

Urethane type addition-polymerizable compounds produced using an addition reaction between an isocyanate and a hydroxy group are also preferably used, and specific examples thereof include vinylurethane compounds having two or more polymerizable vinyl groups per molecule obtained by adding a vinyl monomer containing a hydroxy group represented by formula (A) shown below to a polyisocyanate compound having two or more isocyanate groups per molecule, described in JP-B-48-41708.

$$CH_2=C(R_4)COOCH_2CH(R_5)OH \qquad (A)$$

wherein $R_4$ and $R_5$ each independently represents H or $CH_3$.

Also, urethane acrylates described in JP-A-51-37193, JP-B-2-32293 and JP-B-2-16765, and urethane compounds having an ethylene oxide skeleton described in JP-B-58-49860, JP-B-56-17654, JP-B-62-39417 and JP-B-62-39418 are preferably used. Further, a photopolymerizable composition having remarkably excellent photo-speed can be obtained by using an addition polymerizable compound having an amino structure or a sulfide structure in its molecule, described in JP-A-63-277653, JP-A-63-260909 and JP-A-1-105238.

Other examples include polyfunctional acrylates and methacrylates, for example, polyester acrylates and epoxy acrylates obtained by reacting an epoxy resin with (meth)acrylic acid, described in JP-A-48-64183, JP-B-49-43191 and JP-B-52-30490. Specific unsaturated compounds described in JP-B-46-43946, JP-B-1-40337 and JP-B-1-40336, and vinylphosphonic acid type compounds described in JP-A-2-25493 can also be exemplified. In some cases, structure containing a perfluoroalkyl group described in JP-A-61-22048 can be preferably used. Moreover, photocurable monomers or oligomers described in *Nippon Secchaku Kyokaishi* (*Journal of Japan Adhesion Society*), Vol. 20, No. 7, pages 300 to 308 (1984) can also be used.

Details of the method of using the polymerizable compound, for example, selection of the structure, individual or combination use or an amount added, can be appropriately determined in accordance with the characteristic design of the final lithographic printing plate precursor. For instance, the compound is selected from the following standpoints.

In view of the sensitivity, a structure having a large content of unsaturated group per molecule is preferred and in many cases, a difunctional or more functional compound is preferred. Also, in order to increase the strength of the image area, that is, cured layer, a trifunctional or more functional compound is preferred. A combination use of compounds different in the functional number or in the kind of polymerizable group (for example, an acrylic acid ester, a methacrylic acid ester, a styrene compound or a vinyl ether compound) is an effective method for controlling both the sensitivity and the strength.

The selection and use method of the polymerizable compound are also important factors for the compatibility and dispersibility with other components (for example, a binder polymer, a polymerization initiator or a coloring agent) in the image-forming layer. For instance, the compatibility may be improved in some cases by using the compound of low purity or using two or more kinds of the compounds in combination. A specific structure may be selected for the purpose of improving an adhesion property to a support, a protective layer or the like described hereinafter. In the method of using the polymerizable compound, the structure, blend and amount added can be appropriately selected by taking account of the degree of polymerization inhibition due to oxygen, resolution, fogging property, change in refractive index, surface tackiness and the like. Further, depending on the case, a layer construction, for example, an undercoat layer or an overcoat layer, and a coating method, may also be considered.

The polymerizable compound is used preferably in a range of 5 to 75% by weight, more preferably in a range of 25 to 70% by weight, particularly preferably in a range of 30 to 60% by weight, based on the total solid content of the image-forming layer.

<Binder Polymer>

The binder polymer for use in the image-forming layer according to the invention is preferably a binder polymer having a hydrophilic group from the standpoint of developing property in a developer.

The hydrophilic group is selected from monovalent and divalent or more valent hydrophilic groups, and preferably includes, for example, a hydroxy group, a sulfonic acid group, a carboxylic acid group, a phosphoric acid group, an alkylene oxy group (for example, an ethylene oxy group or a propylene oxy group), a primary amino group, a secondary amino group, a tertiary amino group, a salt formed by neutralization of an amino group with an acid, a quaternary ammonium group, an amido group, an ether group, a salt formed by neutralization of an acid, for example, carboxylic acid, sulfonic acid or phosphoric acid. Especially, a primary amino group, a secondary amino group, a tertiary amino group, a salt formed by neutralization of an amino group with an acid, a quaternary ammonium group, an amido group, a hydroxy group, a repeating unit of —$CH_2CH_2O$— and a repeating unit of —$CH_2CH_2NH$— are preferable, and a tertiary amino group, a salt formed by neutralization of an acid group with an amino group-containing compound, a salt formed by neutralization of an amino group with an acid and a quaternary ammonium group are most preferable.

The binder polymer is preferably a copolymer. The ratio of the copolymerization component having a hydrophilic group as described above is preferably from 1 to 70% by mole based on the total copolymerization component of the copolymer from the standpoint of the developing property. In consideration of the compatibility between the developing property and printing durability, the ratio is more preferably from 1 to 50% by mole, and particularly preferably from 1 to 30% by mole.

It is preferred that the binder polymer for use in the invention does not substantially contain a carboxylic acid group or a phosphoric acid group in view of the developing property and stain resistance.

An acid value (acid content per g of polymer, indicated by the chemical equivalent number) of the binder polymer is preferably 0.3 meq/g or less, and more preferably 0.1 meq/g or less.

The binder polymer for use in the invention is preferably insoluble in water and an aqueous solution having a pH of 10 or more. The solubility (binder polymer concentration at the saturation dissolution) of the binder polymer in water or an aqueous solution having a pH of 10 or more is preferably 10% by weight or less, more preferably 1.0% by weight or less.

The temperature for measuring the above-described solubility is 25° C. which is ordinary temperature at the development in plate making.

As the skeleton of the binder polymer, a polymer selected from an acrylic resin, a polyvinyl acetal resin, a polyvinyl alcohol resin, a polyurethane resin, a polyamide resin, an epoxy resin, a methacrylic resin, a styrene resin and a polyester resin is preferable. Among them, a vinyl copolymer, for example, an acrylic resin, a methacrylic resin or a styrene resin and a polyurethane resin are particularly preferable.

In particular, it is preferred to use a polyurethane resin containing a urethane bond in the invention from the standpoint of increase in the printing durability due to interaction with a chain transfer agent containing a urethane bond.

The binder polymer for use in the invention preferably has a crosslinkable group. The term "crosslinkable group" as used herein means a group capable of crosslinking the binder polymer in the process of a radical polymerization reaction which is caused in the image-forming layer, when the lithographic printing plate precursor is exposed to light. The crosslinkable group is not particularly restricted as long as it has such a function and includes, for example, an ethylenically unsaturated bond group, an amino group or an epoxy group as a functional group capable of conducting an addition polymerization reaction. Also, a functional group capable of forming a radical upon irradiation with light may be used and such a crosslinkable group includes, for example, a thiol group and a halogen atom. Among them, the ethylenically unsaturated bond group is preferable. The ethylenically unsaturated bond group preferably includes a styryl group, a (meth)acryloyl group and an allyl group.

In the binder polymer having a crosslinkable group, for example, a free radical (a polymerization initiating radical or a propagating radical in the process of polymerization of the polymerizable compound) is added to the crosslinkable functional group to cause an addition-polymerization between polymers directly or through a polymerization chain of the polymerizable compound, as a result, crosslinking is formed between polymer molecules to effect curing. Alternatively, an atom (for example, a hydrogen atom on the carbon atom adjacent to the crosslinkable functional group) in the polymer is withdrawn by a free radical to produce a polymer radical and the polymer radicals combine with each other to form crosslinking between polymer molecules to effect curing.

The content of the crosslinkable group (content of radical-polymerizable unsaturated double bond determined by iodine titration) in the binder polymer is preferably from 0.01 to 10.0 mmol, more preferably from 0.05 to 5.0 mmol, most preferably from 0.1 to 2.0 mmol, per g of the binder polymer.

From the standpoint of further improvement in the printing durability, it is preferred that the crosslinkable group is present near the hydrophilic group and both the hydrophilic group and the crosslinkable group may be present in the same polymerization unit.

The binder polymer for use in the invention preferably has a unit of alkyl(meth)acrylate or aralkyl(meth)acrylate besides the unit having a hydrophilic group, the unit having a crosslinkable group or the unit having a hydrophilic group and a crosslinkable group. The alkyl group in the alkyl (meth) acrylate is preferably an alkyl group having from 1 to 5 carbon atoms and more preferably a methyl group. The aralkyl(meth) acrylate includes, for example, benzyl(meth)acrylate.

The binder polymer preferably has a weight average molecular weight of 5,000 or more, more preferably from 10,000 to 300,000, and a number average molecular weight of 1,000 or more, more preferably from 2,000 to 250,000. The polydispersity (weight average molecular weight/number average molecular weight) is preferably from 1.1 to 10.

The binder polymer may be any of a random polymer, a block polymer, a graft polymer and the like.

The binder polymers may be used individually or in combination of two or more thereof. The content of the binder polymer is preferably from 5 to 75% by weight, more preferably from 10 to 70% by weight, still more preferably from 10 to 60% by weight, based on the total solid content of the image-forming layer from the standpoint of good strength of the image area and good image-forming property.

The total content of the polymerizable compound and the binder polymer is preferably 80% by weight or less based on the total solid content of the image-forming layer. When it exceeds 80% by weight, decrease in the sensitivity and deterioration in the developing property may be caused sometimes. The total content is more preferably from 35 to 75% by weight.

Specific examples of the polymerization unit constituting the binder polymer and specific examples of the binder polymer for use in the invention are set forth below, but the invention should not be construed as being limited thereto.

Specific examples of the binder polymer added are set forth below, but the invention should not be construed as being limited thereto. In the tables below, the molecular weight is a weight average molecular weight (Mw) measured by gel permeation chromatography (GPC) and determined using polystyrene as a standard substance.

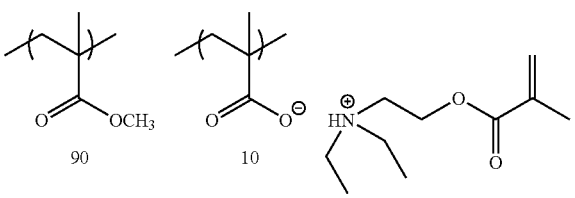

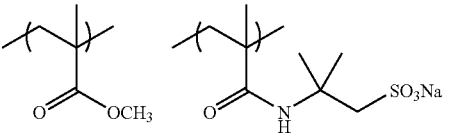

-continued
| Polymer No. | Structure of Binder Polymer (% by mole) | Molecular Weight |
|---|---|---|
| P-5 | 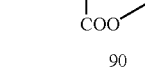 | 60000 |
| P-6 |  | 65000 |
| P-7 | 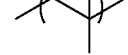 | 60000 |
| P-8 |  | 63000 |
| P-9 | 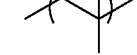 | 60000 |

| Polymer No. | Structure of Binder | Composition Ratio | Molecular Weight |
|---|---|---|---|
| P-10 | (methyl acrylate / 2-(dimethylamino)ethyl acrylate) | 90/10 | 70000 |
| P-11 | (methyl acrylate / 2-[2-(2-(2-methoxyethoxy)ethoxy)ethoxy]ethyl acrylate (n=4) / 2-(dimethylamino)ethyl acrylate) | 90/5/5 | 80000 |
| P-12 | (methyl acrylate / 2-(methacryloyloxy)ethyl acrylate / 2-(diethylamino)ethyl acrylate) | 60/35/5 | 80000 |

| Polymer No | Diisocyanate Compound Used (% by mole) | Diol Compound Used (% by mole) | Molecular Weight |
|---|---|---|---|
| P-13 | 4,4'-methylenebis(phenyl isocyanate) 80; hexamethylene diisocyanate 20 | glyceryl methacrylate 30; 2,2-bis(hydroxymethyl)butanoic acid sodium salt 30; poly(propylene glycol) (Mw=400) 40 | 57000 |

| Polymer No. | Structure of Binder | Composition Ratio | Molecular Weight |
|---|---|---|---|
| P-14 | (methyl acrylate / 2-(dimethylammonio)ethyl acrylate chloride) | 90/10 | 70000 |
| P-15 | (methyl acrylate / 2-(dimethylammonio)ethyl acrylate tosylate) | 90/10 | 58000 |
| P-16 | (allyl acrylate / 2-(diethylamino)ethyl acrylate) | 90/10 | 90000 |

-continued

| Polymer No. | Structure of Binder | Composition Ratio | Molecular Weight |
|---|---|---|---|
| P-17 | (structure with styrene unit and methacrylate with -O-CH₂CH₂-N⁺(CH₃)₂H Br⁻) | 70/30 | 62000 |
| P-18 | (structure with methyl methacrylate unit and methacrylamide with -NH-(CH₂)₃-N⁺(CH₃)₃ Cl⁻) | 70/30 | 58000 |
| P-19 | (structure with butyl acrylate unit, methacrylate with -O-CH₂CH₂-N⁺(CH₃)₂-(CH₂)₃-SO₃⁻, and ethylene glycol dimethacrylate unit) | 50/25/25 | 49000 |

| Polymer No. | Structure of Diisocyanate/Dicarboxylic acid | |
|---|---|---|
| P-20 | OCN-C₆H₄-CH₂-C₆H₄-NCO (40) | OCN-(CH₂)₆-NCO (10) |
| P-21 | OCN-C₆H₄-CH₂-C₆H₄-NCO (40) | OCN-(CH₂)₆-NCO (10) |
| P-22 | OCN-C₆H₄-CH₂-C₆H₄-NCO (40) | OCN-(CH₂)₆-NCO (10) |
| P-23 | OCN-C₆H₄-CH₂-C₆H₄-NCO (40) | OCN-(CH₂)₆-NCO (10) |

| Polymer No. | Structure of Diol/Diamine | | | Molecular Weight |
|---|---|---|---|---|
| P-20 | HO—(CH₂CH—O)ₙ—H, CH₃ (Mw = 1000) 10 | HO—CH₂—CH(OH)—CH₂—N⁺(CH₃)₂H Cl⁻ 25 | HO—CH₂—CH(OH)—CH₂—O—C(=O)—C(CH₃)=CH₂ 15 | 59000 |
| P-21 | HO—(CH₂CH—O)ₙ—H, CH₃ (Mw = 1000) 10 | HO—CH₂—CH(OH)—CH₂—N(CH₃)₂ 25 | HO—CH₂—CH(OH)—CH₂—O—C(=O)—C(CH₃)=CH₂ 15 | 59000 |
| P-22 | HO—(CH₂CH—O)ₙ—H, CH₃ (Mw = 1000) 10 | HO—CH₂—CH(OH)—CH₂—N⁺(Et)₂H ⁻O₃S-camphor 25 | HO—CH₂—CH(OH)—CH₂—O—C(=O)—C(CH₃)=CH₂ 15 | 62000 |
| P-23 | HO-(CH₂)₆-O-C(=O)-O-CH₃ / (CH₂)ₙ-OH 10 | HO—CH₂—CH(OH)—CH₂—N⁺(Et)₂H ⁻O₃S-camphor 25 | HO—CH₂—CH(OH)—CH₂—O—C(=O)—C(CH₃)=CH₂ 15 | 53000 |

| Polymer No. | Structure of Binder (% by mole) | Molecular Weight |
|---|---|---|
| P-24 | —(CH₂CH(OH))₅₅—(CH₂CH(OC(=O)CH₃))₄₅— | 80000 |
| P-25 | —(CH₂CH(OH))₃₀—(CH₂CH(OC(=O)C(CH₃)=CH₂))₁₅—(CH₂CH(OC(=O)CH₃))₄₅— | 100000 |

<Microcapsule>

In the invention, in order to incorporate the above-described constituting components of the image-forming layer and other constituting components described hereinafter into the image-forming layer, a part of the constituting components is encapsulated into microcapsules and added to the image-forming layer as described, for example, in JP-A-2001-277740 and JP-A-2001-277742. In such a case, each constituting component may be present inside or outside the microcapsule in an appropriate ratio.

As a method of microencapsulating the constituting components of the image-forming layer, known methods can be used. Methods for the production of microcapsules include, for example, a method of utilizing coacervation described in U.S. Pat. Nos. 2,800,457 and 2,800,458, a method of using interfacial polymerization described in U.S. Pat. No. 3,287,154, JP-B-38-19574 and JP-B-42-446, a method of using deposition of polymer described in U.S. Pat. Nos. 3,418,250 and 3,660,304, a method of using an isocyanate polyol wall material described in U.S. Pat. No. 3,796,669, a method of using an isocyanate wall material described in U.S. Pat. No.

3,914,511, a method of using a urea-formaldehyde-type or urea-formaldehyde-resorcinol-type wall-forming material described in U.S. Pat. Nos. 4,001,140, 4,087,376 and 4,089,802, a method of using a wall material, for example, a melamine-formaldehyde resin or hydroxycellulose described in U.S. Pat. No. 4,025,445, an in-situ method by polymerization of monomer described in JP-B-36-9163 and JP-B-51-9079, a spray drying method described in British Patent 930,422 and U.S. Pat. No. 3,111,407, and an electrolytic dispersion cooling method described in British Patents 952,807 and 967,074, but the invention should not be construed as being limited thereto.

A preferable microcapsule wall used in the invention has three-dimensional crosslinking and has a solvent-swellable property. From this point of view, a preferable wall material of the microcapsule includes polyurea, polyurethane, polyester, polycarbonate, polyamide and a mixture thereof, and particularly polyurea and polyurethane are preferred. Further, a compound having a crosslinkable functional group, for example, an ethylenically unsaturated bond, capable of being introduced into the binder polymer described above may be introduced into the microcapsule wall.

The average particle size of the microcapsule is preferably from 0.01 to 3.0 µm, more preferably from 0.05 to 2.0 µm, particularly preferably from 0.10 to 1.0 µm. In the range described above, preferable resolution and good preservation stability can be achieved.

<Other Components of Image-Forming Layer>

Into the image-forming layer according to the invention, various additives can be further incorporated, if desired. Examples of the additive include a surfactant for progressing the developing property and improving the state of surface coated, a hydrophilic polymer for improving the developing property and dispersion stability of microcapsule, a coloring agent or print-out agent for visually distinguishing the image area from the non-image area, a polymerization inhibitor for preventing undesirable thermal polymerization of the radical polymerizable compound during the production and preservation of the image-forming layer, a higher fatty acid derivative for avoiding polymerization inhibition due to oxygen, a fine inorganic particle for increasing strength of the cured layer in the image area, a hydrophilic low molecular weight compound for improving the developing property, a co-sensitizer or chain transfer agent for increasing sensitivity, and a plasticizer.

As the additives, known compounds are used. Also, for example, compounds described in JP-A-2007-171406, JP-A-2007-206216, JP-A-2007-206217, JP-A-2007-225701, JP-A-2007-225702, JP-A-2007-316582 and JP-A-2007-328243 are used.

<Formation of Image-Forming Layer>

The image-forming layer according to the invention is formed by dispersing or dissolving each of the necessary constituting components described above to prepare a coating solution and coating the solution. The solvent used include, for example, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene and water, but the invention should not be construed as being limited thereto. The solvents may be used individually or as a mixture. The solid content concentration of the coating solution is preferably from 1 to 50% by weight.

The image-forming layer according to the invention may also be formed by preparing plural coating solutions by dispersing or dissolving the same or different components described above into the same or different solvents and conducting repeatedly plural coating and drying.

The coating amount (solid content) of the image-forming layer on the support after the coating and drying may be varied depending on the use, but ordinarily, it is preferably from 0.3 to 3.0 g/m². In the range described above, the preferable sensitivity and good film property of the image-forming layer can be obtained.

Various methods can be used for the coating. Examples of the method include bar coater coating, spin coating, spray coating, curtain coating, dip coating, air knife coating, blade coating and roll coating.

<Protective Layer>

In the lithographic printing plate precursor according to the invention, a protective layer (oxygen-blocking layer) is preferably provided on the image-forming layer in order to prevent diffusion and penetration of oxygen which inhibits the polymerization reaction at the time of exposure. The protective layer for use in the invention preferably has oxygen permeability (A) at 25° C. under one atmosphere of $1.0 \leq (A) \leq 20$ (ml/m²·day). When the oxygen permeability (A) is extremely lower than 1.0 (ml/m²·day), problems may occur in that an undesirable polymerization reaction arises during the production or preservation before image exposure and in that undesirable fog or spread of image line occurs at the image exposure. On the contrary, when the oxygen permeability (A) greatly exceeds 20 (ml/m²·day), decrease in sensitivity may be incurred. The oxygen permeability (A) is more preferably in a range of $1.5 \leq (A) \leq 12$ (ml/m²·day), and still more preferably in a range of $2.0 \leq (A) \leq 10.0$ (ml/m²·day). Besides the above described oxygen permeability, as for the characteristics required of the protective layer, it is desired that the protective layer does not substantially hinder the transmission of light for the exposure, is excellent in the adhesion property to the image-forming layer, and can be easily removed during a development step after the exposure. Contrivances on the protective layer have been heretofore made and described in detail in U.S. Pat. No. 3,458,311 and JP-B-55-49729.

As the material for the protective layer, a water-soluble polymer compound relatively excellent in crystallizability is preferably used. Specifically, a water-soluble polymer, for example, polyvinyl alcohol, vinyl alcohol/vinyl phthalate copolymer, vinyl acetate/vinyl alcohol/vinyl phthalate copolymer, vinyl acetate/crotonic acid copolymer, polyvinyl pyrrolidone, acidic cellulose, gelatin, gum arabic, polyacrylic acid or polyacrylamide is enumerated. The water-soluble polymer compounds may be used individually or as a mixture. Of the compounds, when polyvinyl alcohol is used as a main component, the best results can be obtained in the fundamental characteristics, for example, oxygen-blocking property and removability of the protective layer by development.

Polyvinyl alcohol for use in the protective layer may be partially substituted with ester, ether or acetal as long as it contains unsubstituted vinyl alcohol units for achieving the necessary oxygen-blocking property and water solubility. Also, a part of polyvinyl alcohol may have other copolymer component. As specific examples of the polyvinyl alcohol, those having a hydrolysis degree of 71 to 100% and a polymerization repeating unit number of 300 to 2,400 are exemplified. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA- 205, PVA-210, PVA-217, PVA-220, PVA-224, PVA-217EE, PVA-217E, PVA-220E, PVA-224E, PVA405, PVA-420, PVA-613 and L-8 (produced by Kuraray Co., Ltd.). They can be used individually or as a mixture. According to a preferred embodiment, the content of polyvinyl alcohol in the protective layer is from 20 to 95% by weight, and more preferably from 30 to 90% by weight.

Also, known modified polyvinyl alcohol can be preferably used. For instance, polyvinyl alcohols of various polymerization degrees having at random a various kind of hydrophilic modified cites, for example, an anion-modified cite modified with an anion, e.g., a carboxyl group or a sulfo group, a cation-modified cite modified with a cation, e.g., an amino group or an ammonium group, a silanol-modified cite or a thiol-modified cite, and polyvinyl alcohols of various polymerization degrees having at the terminal of the polymer a various kind of modified cites, for example, the above-described anion-modified cite, cation modified cite, silanol-modified cite or thiol-modified cite, an alkoxy-modified cite, a sulfide-modified cite, an ester modified cite of vinyl alcohol with a various kind of organic acids, an ester modified cite of the above-described anion-modified cite with an alcohol or an epoxy-modified cite are exemplified.

As a component used as a mixture with polyvinyl alcohol, polyvinyl pyrrolidone or a modified product thereof is preferable from the viewpoint of the oxygen-blocking property and removability by development. The content thereof is ordinarily from 3.5 to 80% by weight, preferably from 10 to 60% by weight, more preferably from 15 to 30% by weight, in the protective layer.

The components of the protective layer (selection of PVA and use of additives) and the coating amount are determined taking into consideration fogging property, adhesion property and scratch resistance besides the oxygen-blocking property and removability by development. In general, the higher the hydrolyzing rate of the PVA used (the higher the unsubstituted vinyl alcohol unit content in the protective layer) and the larger the layer thickness, the higher is the oxygen-blocking property, thus it is advantageous in the point of sensitivity. The molecular weight of the polymer, for example, polyvinyl alcohol (PVA) is ordinarily from 2,000 to 10,000,000, preferably from 20,000 to 3,000,000.

As other additive of the protective layer, glycerin, dipropylene glycol or the like can be added in an amount corresponding to several % by weight of the polymer to provide flexibility. Further, an anionic surfactant, for example, sodium alkylsulfate or sodium alkylsulfonate, an amphoteric surfactant, for example, alkylaminocarboxylate and alkylaminodicarboxylate, or a nonionic surfactant, for example, polyoxyethylene alkyl phenyl ether can be added in an amount corresponding to several % by weight of the polymer.

The adhesion property of the protective layer to the image-forming layer and scratch resistance are also extremely important in view of handling of the printing plate precursor. Specifically, when a hydrophilic layer comprising a water-soluble polymer is laminated on the oleophilic image-forming layer, layer peeling due to an insufficient adhesion property is liable to occur, and the peeled portion causes such a defect as failure in curing of the image-forming layer due to polymerization inhibition by oxygen. Various proposals have been made for improving the adhesion property between the image-forming layer and the protective layer. For example, it is described in U.S. patent application Ser. Nos. 292,501 and 44,563 that a sufficient adhesion property can be obtained by mixing from 20 to 60% by weight of an acryl-based emulsion or a water-insoluble vinyl pyrrolidone/vinyl acetate copolymer with a hydrophilic polymer mainly comprising polyvinyl alcohol and laminating the resulting mixture on the image-forming layer. Any of these known techniques can be applied to the protective layer according to the invention. Coating methods of the protective layer are described in detail, for example, in U.S. Pat. No. 3,458,311 and JP-B-55-49729.

Further, it is also preferred to incorporate an inorganic stratiform compound into the protective layer of the lithographic printing plate precursor according to the invention for the purpose of improving the oxygen-blocking property and property for protecting the surface of image-forming layer.

The inorganic stratiform compound used here is a particle having a thin tabular shape and includes, for instance, mica, for example, natural mica represented by the following formula: $A(B, C)_{2-5} D_4 O_{10} (OH, F, O)_2$, (wherein A represents any one of K, Na and Ca, B and C each represents any one of Fe (II), Fe(III), Mn, Al, Mg and V, and D represents Si or Al) or synthetic mica, talc represented by the following formula: $3MgO \cdot 4SiO \cdot H_2O$, teniolite, montmorillonite, saponite, hectoliter and zirconium phosphate.

Of the inorganic stratiform compounds, fluorine based swellable synthetic mica, which is a synthetic inorganic stratiform compound, is particularly useful in the invention.

The aspect ratio of the inorganic stratiform compound according to the invention is preferably 20 or more, more preferably 100 or more, and particularly preferably 200 or more. The aspect ratio is a ratio of major axis to thickness of particle and can be determined, for example, from a projection drawing of particle by a microphotography. The larger the aspect ratio, the greater the effect obtained.

As for the particle size of the inorganic stratiform compound used in the invention, an average major axis is ordinarily from 0.3 to 20 µm, preferably from 0.5 to 10 µm, and particularly preferably from 1 to 5 µm. An average thickness of the particle is ordinarily 0.1 µm or less, preferably 0.05 µm or less, and particularly preferably 0.01 µm or less. For example, in the swellable synthetic mica that is the representative compound of the inorganic stratiform compounds, thickness is approximately from 1 to 50 nm and plain size is approximately from 1 to 20 µm.

When such an inorganic stratiform compound particle having a large aspect ratio is incorporated into the protective layer, strength of coated layer increases and penetration of oxygen or moisture can be effectively inhibited and thus, the protective layer can be prevented from deterioration due to deformation, and even when the lithographic printing plate precursor is preserved for a long period of time under a high humidity condition, it is prevented from decrease in the image-forming property thereof due to the change of humidity and exhibits excellent preservation stability.

The content of the inorganic stratiform compound in the protective layer is preferably from 5/1 to 1/100 in terms of weight ratio to the amount of binder used in the protective layer. When a plurality of inorganic stratiform compounds is used in combination, it is also preferred that the total amount of the inorganic stratiform compounds fulfills the above-described weight ratio.

As a dispersing method for the inorganic stratiform compound used in the protective layer, methods described in JP-A-2007-171406, JP-A-2007-206216, JP-A-2007-206217, JP-A-2007-225701, JP-A-2007-225702, JP-A-2007-316582 and JP-A-2007-328243 are used.

The coating amount of the protective layer is preferably in a range of 0.05 to 10 g/m² in terms of the coating amount after drying. When the protective layer contains the inorganic stratiform compound, it is more preferably in a range of 0.1 to 0.5 g/m², and when the protective layer does not contain the inorganic stratiform compound, it is more preferably in a range of 0.5 to 5 g/m².

The support for use in the lithographic printing plate precursor according to the invention is not particularly restricted as long as it is a dimensionally stable plate-like hydrophilic support. The support includes, for example, paper, paper laminated with plastic (for example, polyethylene, polypropylene or polystyrene), a metal plate (for example, aluminum, zinc or copper plate), a plastic film (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal film) and paper or a plastic film laminated or deposited with the metal described above. Preferable examples of the support include a polyester film and an aluminum plate. Among them, the aluminum plate is preferred since it has good dimensional stability and is relatively inexpensive.

The aluminum plate includes a pure aluminum plate, an alloy plate comprising aluminum as a main component and containing a trace amount of hetero elements and a thin film of aluminum or aluminum alloy laminated with plastic. The hetero element contained in the aluminum alloy includes, for example, silicon, iron, manganese, copper, magnesium, chromium, zinc, bismuth, nickel and titanium. The content of the hetero element in the aluminum alloy is preferably 10% by weight or less. Although a pure aluminum plate is preferred in the invention since completely pure aluminum is difficult to be produced in view of the refining technique, the aluminum plate may slightly contain the hetero element. The composition is not specified for the aluminum plate and those materials conventionally known and used can be appropriately utilized.

The thickness of the support is preferably from 0.1 to 0.6 mm, more preferably from 0.15 to 0.4 mm, and still more preferably from 0.2 to 0.3 mm.

Prior to the use of aluminum plate, a surface treatment, for example, roughening treatment or anodizing treatment is preferably performed. The surface treatment facilitates improvement in the hydrophilic property and ensures adhesion between the image-forming layer and the support. In advance of the roughening treatment of the aluminum plate, a degreasing treatment, for example, with a surfactant, an organic solvent or an aqueous alkaline solution is conducted for removing rolling oil on the surface thereof, if desired.

The roughening treatment of the surface of the aluminum plate is conducted by various methods and includes, for example, mechanical roughening treatment, electrochemical roughening treatment (roughening treatment of electrochemically dissolving the surface) and chemical roughening treatment (roughening treatment of chemically dissolving the surface selectively).

As the method of the mechanical roughening treatment, a known method, for example, a ball graining method, a brush graining method, a blast graining method or a buff graining method can be used.

The electrochemical roughening treatment method includes, for example, a method of conducting it by passing alternating current or direct current in an electrolytic solution containing an acid, for example, hydrochloric acid or nitric acid. Also, a method of using a mixed acid described in JP-A-54-63902 can be used.

The aluminum plate after the roughening treatment is then subjected, if desired, to an alkali etching treatment using an aqueous solution, for example, of potassium hydroxide or sodium hydroxide and further subjected to a neutralizing treatment, and then subjected to an anodizing treatment in order to enhance the abrasion resistance, if desired.

As the electrolyte used for the anodizing treatment of the aluminum plate, various electrolytes capable of forming porous oxide film can be used. Ordinarily, sulfuric acid, hydrochloric acid, oxalic acid, chromic acid or a mixed acid thereof is used. The concentration of the electrolyte can be appropriately determined depending on the kind of the electrolyte.

Since the conditions of the anodizing treatment are varied depending on the electrolyte used, they cannot be defined generally. However, it is ordinarily preferred that electrolyte concentration in the solution is from 1 to 80% by weight, liquid temperature is from 5 to 70° C., current density is from 5 to 60 A/dm², voltage is from 1 to 100 V, and electrolysis time is from 10 seconds to 5 minutes. The amount of the anodized film formed is preferably from 1.0 to 5.0 g/m², and more preferably from 1.5 to 4.0 g/m². In the range described above, good printing durability and good scratch resistance in the non-image area of lithographic printing plate can be achieved.

The aluminum plate subjected to the surface treatment and having the anodized film is used as it is as the support in the invention. However, in order to more improve an adhesion property to a layer provided thereon, hydrophilicity, resistance to stain, heat insulating property or the like, other treatment, for example, a treatment for enlarging micropores or a sealing treatment of micropores of the anodized film described in JP-A-2001-253181 and JP-A-2001-322365, or a surface hydrophilizing treatment by immersing in an aqueous solution containing a hydrophilic compound, may be appropriately conducted. Needless to say, the enlarging treatment and sealing treatment are not limited to those described in the above-described patents and any conventionally known method may be employed.

As the sealing treatment, as well as a sealing treatment with steam, a sealing treatment with an aqueous solution containing an inorganic fluorine compound, for example, fluorozirconic acid alone or sodium fluoride, a sealing treatment with steam having added thereto lithium chloride or a sealing treatment with hot water may be employed.

Among them, the sealing treatment with an aqueous solution containing an inorganic fluorine compound, the sealing treatment with steam and the sealing treatment with hot water are preferred.

The hydrophilizing treatment includes an alkali metal silicate method described in U.S. Pat. Nos. 2,714,066, 3,181,461, 3,280,734 and 3,902,734. In the method, the support is subjected to an immersion treatment or an electrolytic treatment in an aqueous solution, for example, of sodium silicate. In addition, the hydrophilizing treatment includes, for example, a method of treating with potassium fluorozirconate described in JP-B-36-22063 and a method of treating with polyvinylphosphonic acid described in U.S. Pat. Nos. 3,276,868, 4,153,461 and 4,689,272.

The aluminum support for use in the invention may be subjected to an alkali metal silicate treatment as described in U.S. Pat. Nos. 2,714,066, 3,181,461, 3,280,734 and 3,902,734. In the method, the support is subjected to an immersion treatment or an electrolytic treatment in an aqueous solution, for example, of sodium silicate. By the alkali metal silicate treatment, hydrophilic property is increased and stain resistance is improved. The coating amount of silicate on the aluminum support according to the alkali metal silicate treatment is preferably from 0.5 to 50 mg/m², more preferably from 1 to 40 mg/m², particularly preferably from 1.5 to 30 mg/m², in terms of amount of silicon atom.

In the case of using a support having a surface of insufficient hydrophilicity, for example, a polyester film, in the invention, it is desirable to coat a hydrophilic layer thereon to make the surface sufficiently hydrophilic. Examples of the hydrophilic layer preferably includes a hydrophilic layer formed by coating a coating solution containing a colloid of oxide or hydroxide of at least one element selected from beryllium, magnesium, aluminum, silicon, titanium, boron, germanium, tin, zirconium, iron, vanadium, antimony and a transition metal described in JP-A-2001-199175, a hydrophilic layer containing an organic hydrophilic matrix obtained by crosslinking or pseudo-crosslinking of an organic hydrophilic polymer described in JP-A-2002-79772, a hydrophilic layer containing an inorganic hydrophilic matrix obtained by sol-gel conversion comprising hydrolysis and condensation reaction of polyalkoxysilane and titanate, zirconate or aluminate, and a hydrophilic layer comprising an inorganic thin layer having a surface containing metal oxide. Among them, the hydrophilic layer formed by coating a coating solution containing a colloid of oxide or hydroxide of silicon or aluminum or performance of the alkali metal silicate treatment described above is preferred.

The support preferably has a center line average roughness of 0.10 to 1.2 μm. In the range described above, good adhesion property to the image-forming layer, good printing durability, and good resistance to stain can be achieved.

The color density of the support is preferably from 0.15 to 0.65 in terms of the reflection density value. In the range described above, good image-forming property by preventing halation at the image exposure and good aptitude for plate inspection after development can be achieved.

[Backcoat Layer]

After applying the surface treatment to the support or forming the undercoat layer on the support, a backcoat layer can be provided on the back surface of the support, if desired.

The backcoat layer preferably includes, for example, a coating layer comprising an organic polymer compound described in JP-A-5-45885 and a coating layer comprising a metal oxide obtained by hydrolysis and polycondensation of an organic metal compound or an inorganic metal compound described in JP-A-6-35174. Among them, use of an alkoxy compound of silicon, for example, $Si(OCH_3)_4$, $Si(OC_2H_5)_4$, $Si(OC_3H_7)_4$ or $Si(OC_4H_9)_4$ is preferred since the starting material is inexpensive and easily available.

[Plate Making Method]

The lithographic printing plate precursor according to the invention is imagewise exposed and subjected to development processing to prepare a lithographic printing plate precursor. The development processing includes (a) method of developing with an alkali developer (having pH higher than 10), (b) method of developing with a developer having pH of 2 to 10, and (c) method of developing (on-press development) by supplying dampening water and/or ink on a printing machine. Although the development processing is not restricted, the method of developing with a developer having pH of 2 to 10 is preferable in the invention.

Specifically, after removing the protective layer and the unexposed area of the image-forming layer all at once, the lithographic printing plate precursor according to the invention is immediately mounted on a printing machine to conduct printing.

The processing by an automatic development processor in such a manner is advantageous in view of being free from the measures against development scum resulting from the protective layer and image-forming layer encountered in case of performing on-press development.

The developer for use in the invention is preferably an aqueous solution having pH of 2 to 10. For instance, the developer is preferably water alone or an aqueous solution containing water as a main component (containing 60% by weight or more of water). Particularly, an aqueous solution having the same composition as conventionally known dampening water, an aqueous solution containing a surfactant (for example, an anionic, nonionic or cationic surfactant) or an aqueous solution containing a water-soluble polymer compound is preferable. An aqueous solution containing both a surfactant and a water-soluble polymer compound is especially preferable. The pH of the developer is preferably from 3 to 8, and more preferably from 4 to 7.

In the case of using an acidic to neutral developer, the developer preferably includes either an organic acid or an inorganic acid. By incorporating the organic acid or inorganic acid into the developer, the developing property can be improved at the plate making and the occurrence of stain in the non-image area of a printing plate obtained by the plate making can be prevented.

The anionic surfactant for use in the developer according to the invention is not particularly restricted, and dialkylsulfosuccinic acid salts, alkyl sulfate ester salts and alkylnaphthalenesulfonic acid salts are preferably used.

The cationic surfactant for use in the developer according to the invention is not particularly limited and conventionally known cationic surfactants can be used. Examples of the cationic surfactant include alkylamine salts, quaternary ammonium salts, polyoxyethylene alkyl amine salts and polyethylene polyamine derivatives.

The nonionic surfactant for use in the developer according to the invention preferably includes ethylene oxide addacts of sorbitol and/or sorbitan fatty acid esters, polypropylene glycol ethylene oxide addacts, dimethylsiloxane-ethylene oxide block copolymers, dimethylsiloxane-(propylene oxide-ethylene oxide) block copolymers and fatty acid esters of polyhydric alcohols.

Two or more of the surfactants may be used in combination. The amount of the surfactant contained in the developer is preferably from 0.01 to 20% by weight, more preferably from 0.1 to 10% by weight.

The water-soluble polymer compound for use in the developer according to the invention includes, for example, soybean polysaccharide, modified starch, gum arabic, dextrin, a cellulose derivative (for example, carboxymethyl cellulose, carboxyethyl cellulose or methyl cellulose) or a modified product thereof, pllulan, polyvinyl alcohol or a derivative thereof, polyvinyl pyrrolidone, polyacrylamide, an acrylamide copolymer, a vinyl methyl ether/maleic anhydride copolymer, a vinyl acetate/maleic anhydride copolymer and a styrene/maleic anhydride copolymer.

As the soybean polysaccharide, those known can be used. For example, as a commercial product, Soyafive (trade name, produced by Fuji Oil Co., Ltd.) is available and various grade products can be used. The soybean polysaccharide preferably used has viscosity in a range of 10 to 100 mPa/sec in a 10% by weight aqueous solution thereof.

As the modified starch, known modified starch can be used. The modified starch can be prepared, for example, by a method wherein starch, for example, of corn, potato, tapioca, rice or wheat is decomposed, for example, with an acid or an enzyme to an extent that the number of glucose residue per molecule is from 5 to 30 and then oxypropylene is added thereto in an alkali.

Two or more of the water-soluble polymer compounds may be used in combination. The content of the water-soluble polymer compound is preferably from 0.1 to 20% by weight, more preferably from 0.5 to 10% by weight, in the developer.

The developer for use in the invention may contain an organic solvent. The organic solvent that can be contained in the developer include, for example, an aliphatic hydrocarbon (e.g., hexane, heptane, Isopar E, Isopar H, Isopar G (produced by Esso Chemical Co., Ltd.), gasoline or kerosene), an aromatic hydrocarbon (e.g., toluene or xylene), a halogenated hydrocarbon (methylene dichloride, ethylene dichloride, trichlene or monochlorobenzene) and a polar solvent.

Further, when the organic solvent is insoluble in water, it may be employed by being solubilized in water using a surfactant or the like. In the case where the developer contains the organic solvent, the concentration of the organic solvent is desirably less than 40% by weight in view of safety and inflammability.

Into the developer for use in the invention, an antiseptic agent, a chelating agent, a defoaming agent, an organic acid, an inorganic acid, an inorganic salt or the like can be incorporated in addition to the above components.

The developer described above can be used as a developer and a development replenisher for an exposed negative-working lithographic printing plate precursor and it is preferably applied to an automatic development processor described hereinafter. In the case of conducting the development processing using an automatic development processor, the developer becomes fatigued in accordance with the processing amount, and hence the processing ability may be restored using a replenisher or a fresh developer. Such a replenishment system can be preferably applied to the plate making method of the lithographic printing plate precursor according to the invention.

The development processing using the aqueous solution having pH of 2 to 10 according to the invention is preferably performed by an automatic development processor equipped with a supplying means for a developer and a rubbing member. As the automatic development processor, there are illustrated an automatic development processor in which a lithographic printing plate precursor after image-recording is subjected to a rubbing treatment while it is transporting described in JP-A-2-220061 and JP-A-60-59351, and an automatic development processor in which a lithographic printing plate precursor after image-recording placed on a cylinder is subjected to a rubbing treatment while rotating the cylinder described in U.S. Pat. Nos. 5,148,746 and 5,568,768 and British Patent 2,297,719. Among them, the automatic development processor using a rotating brush roll as the rubbing member is particularly preferred.

The rotating brush roller which can be preferably used in the invention can be appropriately selected by taking account, for example, of scratch resistance of the image area and nerve strength of the support of the lithographic printing plate precursor. As for the rotating brush roller, a known rotating brush roller produced by implanting a brush material in a plastic or metal roller can be used. For example, a rotating brush roller described in JP-A-58-159533 and JP-A-3-100554, or a brush roller described in JP-U-B-62-167253 (the term "JP-UM-B" as used herein means an "examined Japanese utility model publication"), in which a metal or plastic groove-type member having implanted therein in rows a brush material is closely radially wound around a plastic or metal roller acting as a core, can be used.

As the brush material, a plastic fiber (for example, a polyester-based synthetic fiber, e.g., polyethylene terephthalate or polybutylene terephthalate, a polyamide-based synthetic fiber, e.g., nylon 6.6 or nylon 6.10, a polyacrylic synthetic fiber, e.g., polyacrylonitrile or polyalkyl(meth)acrylate, and a polyolefin-based synthetic fiber, e.g., polypropylene or polystyrene) can be used. For instance, a brush material having a fiber bristle diameter of 20 to 400 μm and a bristle length of 5 to 30 mm can be preferably used.

The outer diameter of the rotating brush roller is preferably from 30 to 200 mm, and the peripheral velocity at the tip of the brush rubbing the plate surface is preferably from 0.1 to 5 m/sec.

Further, it is preferred to use a plurality, that is, two or more of the rotating brush rollers.

The rotary direction of the rotating brush roller for use in the invention may be the same direction or the opposite direction with respect to the transporting direction of the lithographic printing plate precursor according to the invention, but when two or more rotating brush rollers are used in an automatic development processor as shown in FIG. 1, it is preferred that at least one rotating brush roller rotates in the same direction and at least one rotating brush roller rotates in the opposite direction with respect to the transporting direction of the lithographic printing plate precursor. By such arrangement, the image-forming layer in the non-image area can be more steadily removed. Further, a technique of rocking the rotating brush roller in the rotation axis direction of the brush roller is also effective.

The developer can be used at an appropriate temperature, and the developer temperature is preferably from 10 to 50° C.

In the invention, the lithographic printing plate after the rubbing treatment may be subsequently subjected to water washing, a drying treatment and an oil-desensitization treatment, if desired. In the oil-desensitization treatment, a known oil-desensitizing solution can be used.

Further, in a plate-making process of the lithographic printing plate precursor to prepare a lithographic printing plate according to the invention, the entire surface of the lithographic printing plate precursor may be heated, if desired, before or during the exposure or between the exposure and the development. By the heating, the image-forming reaction in the image-forming layer is accelerated and advantages, for example, improvement in the sensitivity and printing durability and stabilization of the sensitivity are achieved. For the purpose of increasing the image strength and printing durability, it is also effective to perform entire after-heating or entire exposure of the image after the development. Ordinarily, the heating before the development is preferably performed under a mild condition of 150° C. or lower. When the temperature is too high, a problem may arise in that undesirable fog occurs in the non-image area. On the other hand, the heating after the development can be performed using a very strong condition. Ordinarily, the heat treatment is carried out in a temperature range of 200 to 500° C. When the temperature is too low, a sufficient effect of strengthening the image may not be obtained, whereas when it is excessively high, problems of deterioration of the support and thermal decomposition of the image area may occur.

In advance of the above-described development processing, the lithographic printing plate precursor is imagewise exposed with laser through a transparent original having a line image, a halftone dot image or the like, or imagewise exposed, for example, by scanning of laser beam based on digital data.

The wavelength of the exposure light source is preferably from 350 to 450 nm or from 700 to 1,200 nm. In case of exposing with light of 350 to 450 nm, the lithographic printing plate precursor having an image-forming layer containing a sensitizing dye having an absorption maximum in the wavelength range is used. In case of exposing with light of 700 to 1,200 nm, the lithographic printing plate precursor containing an infrared absorbing agent which is a sensitizing dye having an absorption maximum in the wavelength range is used. As the light source of 350 to 450 nm, a semiconductor laser is preferably used. As the light source of 700 to 1,200 nm, a solid laser or semiconductor laser emitting an infrared ray is preferably used. The exposure mechanism may be any of an internal drum system, an external drum system and a flat bed system.

EXAMPLES

The present invention will be described in more detail with reference to the following examples, but the invention should not be construed as being limited thereto.

Examples 1 to 4 and Comparative Examples 1 to 4

<Preparation of Lithographic Printing Plate Precursors (1) to (8)>
(Preparation of Aluminum Support 1)

An aluminum plate having a thickness of 0.3 mm was immersed in an aqueous 10% by weight sodium hydroxide solution at 60° C. for 25 seconds to effect etching, washed with running water, neutralized and cleaned with an aqueous 20% by weight nitric acid solution and then washed with water. The aluminum plate was subjected to an electrolytic surface roughening treatment in an aqueous 1% by weight nitric acid solution using an alternating current with a sinusoidal waveform at an anode time electricity of 300 coulomb/$dm^2$. Subsequently, the aluminum plate was immersed in an aqueous 1% by weight sodium hydroxide solution at 40° C. for 5 seconds, immersed in an aqueous 30% by weight sulfuric acid solution at 60° C. for 40 seconds to effect a desmut treatment, and then subjected to an anodizing treatment in an aqueous 20% by weight sulfuric acid solution for 2 minutes at a current density of 2 $A/dm^2$ so as to form an anodic oxide film having a thickness of 2.7 $g/m^2$. The center line average roughness of the thus-treated aluminum plate was measured and found to be 0.3 μm (Ra indication according to JIS B0601).

On the back surface of the aluminum plate, a coating solution for backcoat layer shown below was coated by a bar coater and dried at 100° C. for 1 minute, thereby preparing an aluminum support having provided thereon a backcoat layer having a coating amount after drying of 70 $mg/m^2$.
<Coating Solution for Backcoat Layer>

| Tetraethyl silicate | 50 parts by weight |
| Water | 20 parts by weight |
| Methanol | 15 parts by weight |
| Phosphoric acid | 0.05 parts by weight |

The above components were mixed and stirred and heat generation was started within about 5 minutes. After the mixture was reacted for 60 minutes, a solution having the composition shown below was added thereto to prepare a coating solution for backcoat layer.

| Pyrogallol formaldehyde condensation resin (molecular weight: 2,000) | 4 parts by weight |
| Dimethyl phthalate | 5 parts by weight |
| Fluorine-based surfactant (N-butylperfluorooctane-sulfonamidoethyl acrylate/polyoxyethylene acrylate copolymer, molecular weight: 20,000) | 0.7 parts by weight |

| Methanol silica sol (produced by Nissan Chemical Industries, Ltd., 30% by weight in methanol) | 50 parts by weight |
| Methanol | 800 parts by weight |

(Formation of Under Layer)

A coating solution for under layer having the composition shown below was coated on the aluminum support provided with the backcoat layer described above so as to have a dry coating amount of 10 $mg/m^2$ and dried at 100° C. for one minute to form an under layer.
<Coating Solution for Under Layer>

| Polymer compound shown in Table 1 below | 1 g |
| Methanol | 1,000 g |

(Formation of Image-Forming Layer)

Coating solution 1 for image-forming layer having the composition shown below was coated on the aluminum support provided with the under layer described above so as to have a dry coating amount of 1.3 $g/m^2$ and dried at 100® C. for one minute to form an image-forming layer.
<Coating Solution 1 for Image-Forming Layer>

| Radical polymerizable compound Isocyanuric acid EO-modified triacrylate (Aronics M-315, produced by Toa Gosei Co., Ltd.) | 0.40 g |
| Radical polymerizable compound Ethoxylated trimethylolpropane triacrylate (SR9035, produced by Nippon Kayaku Co., Ltd.; EO addition molar number: 15) | 0.13 g |
| Binder Polymer (1) shown below (weight average molecular weight: 100,000) | 0.54 g |
| Polymerization Initiator (1) shown below | 0.18 g |
| Sensitizing Dye (1) shown below | 0.06 g |
| Chain Transfer Agent (1) shown below | 0.07 g |
| Dispersion of ε-phthalocyanine pigment shown below | 0.40 g |
| Thermal polymerization inhibitor N-nitrosophenylhydroxylamine aluminum salt | 0.01 g |
| Fluorine-Based Surfactant (1) shown below | 0.001 g |
| 1-Methoxy-2-propanol | 3.5 g |
| Methyl ethyl ketone | 8.0 g |

Binder Polymer (1):

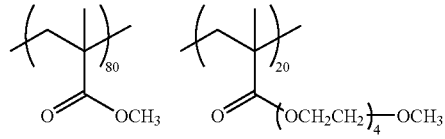

Sensitizing Dye (1):

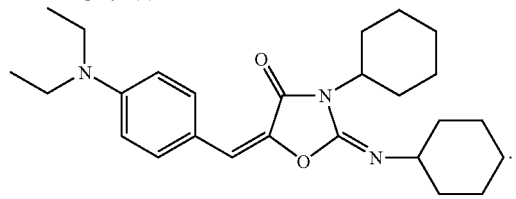

-continued

Polymerization Initiator (1):

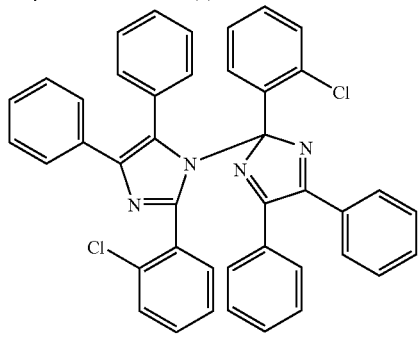

Chain Transfer Agent (1):

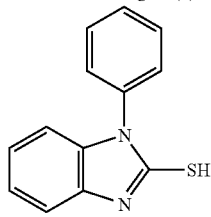

Fluorine-Based Surfactant (1):

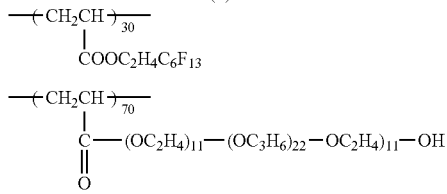

<Dispersion of ε-phthalocyanine Pigment>

The pigment (15 parts by weight), methacrylic acid/allyl methacrylate (20% by mole/80% by mole) copolymer (10 parts by weight), cyclohexanone (15 parts by weight), methoxypropyl acetate (20 parts by weight) and 1-methoxy-2-propanol (40 parts by weight) were mixed and glass beads were added to the mixture, followed by dispersing using a paint shaker for one hour to prepare a dispersion of the pigment.

(Formation of Protective Layer)

Coating solution 1 for protective layer having the composition shown below was coated on the image-forming layer described above so as to have a dry coating amount of 0.5 g/m² and dried at 100° C. for one minute to form a protective layer.

<Coating Solution 1 for Protective Layer>

| | |
|---|---|
| Dispersion of Mica (1) shown below | 13.00 g |
| Polyvinyl alcohol (PVA-105, produced by Kuraray Co., Ltd.; saponification degree: 98% by mole; polymerization degree: 500) | 1.30 g |
| Sodium 2-ethylhexylsulfosuccinate | 0.20 g |
| Vinyl pyrrolidone/vinyl acetate (1/1) copolymer (molecular weight: 70,000) | 0.05 g |
| Surfactant (Emalex 710, produced by Nihon-Emulsion Co., Ltd.) | 0.05 g |
| Water | 133.00 g |

<Preparation of Dispersion of Mica (1)>

In 368 g of water was added 32 g of synthetic mica (SOMASIF ME-100, produced by CO-OP Chemical Co., Ltd.; aspect ratio: 1,000 or more) and the mixture was dispersed using a homogenizer until the average particle diameter (measured by a laser scattering method) became 0.5 μm to obtain Dispersion of Mica (1).

(1) Exposure, Development and Printing

Each of Lithographic Printing Plate Precursors (1) to (8) was subjected to imagewise exposure using a semiconductor laser of 405 nm having an output of 100 mW with varying energy density.

Then, development processing was performed in an automatic development processor having a structure shown in FIG. 1 using Developer (1) having the composition shown below. The pH of the developer was 7. The automatic development processor had two rotating brush rollers. With respect to the rotating brush rollers, the first brush roller was a brush roller having an outer diameter of 90 mm and being implanted with fiber of polybutylene terephthalate (bristle diameter: 200 μm, bristle length: 17 mm), and the brush roller was rotated at 200 rpm (peripheral velocity at the tip of brush: 0.94 m/sec) in the same direction as the transporting direction of the lithographic printing plate precursor. The second brush roller was a brush roller having an outer diameter of 60 mm and being implanted with fiber of polybutylene terephthalate (bristle diameter: 200 μm, bristle length: 17 mm), and the brush roller was rotated at 200 rpm (peripheral velocity at the tip of brush: 0.63 m/sec) in the opposite direction to the transporting direction.

The developer was supplied on the surface of the lithographic printing plate precursor by showering from a spray pipe using a circulation pump. The tank volume for the developer was 10 liters.

| (Developer (1)) | |
|---|---|
| Water | 100.00 g |
| Benzyl alcohol | 1.00 g |
| Polyoxyethylene naphthyl ether (average number of oxyethylene: n = 13) | 1.00 g |
| Sodium salt of dioctylsulfosuccinic acid ester | 0.50 g |
| Gum arabic (Mw: 250,000) | 1.00 g |
| Ethylene glycol | 0.50 g |
| Ammonium primary phosphate | 0.05 g |
| Citric acid | 0.05 g |
| Tetrasodium Ethylenediaminetetraacetate | 0.05 g |

On the other hand, within 30 seconds after the laser exposure, the exposed lithographic printing plate precursor was put in an oven and heated the entire surface of the lithographic printing plate precursor by blowing hot air to maintain at 110° C. for 15 seconds and then the development processing was performed within 30 seconds in the same manner as described above to prepare a lithographic printing plate (with heating).

Then, each of the lithographic printing plate (without heating) and the lithographic printing plate (with heating) was mounted on a printing machine (SOR-M, produced by Heidelberg) and printing was performed at a printing speed of 6,000 sheets per hour using dampening water (EU-3 (etching solution, produced by Fuji Film Co., Ltd.))/water/isopropyl alcohol=1/89/10 (by volume ratio)) and TRANS-G (N) black ink (produced by Dainippon Ink & Chemicals, Inc.).

(2) Evaluation

Using the lithographic printing plate precursor described above, developing property, sensitivity, printing durability and stain resistance were evaluated in the following manner. The results obtained are shown in Table 1.

<Developing Property>

The transporting speed of the lithographic printing plate precursor necessary for completely removing the non-image area of the lithographic printing plate precursor under the development conditions described above was determined to relatively evaluate the developing property. Specifically, the developing property was calculated according to the formula shown below using Comparative Examples 1 to 4 as the criterions (100) respectively. The larger number means the higher developing property.

Developing property=(Transporting speed for subject lithographic printing plate precursor)/(Transporting speed for criterion lithographic printing plate precursor)×100

<Sensitivity>

After performing printing of 100 sheets as described above and confirming that a printed material free from ink stain in the non-image area was obtained, 500 sheets were continuously printed. The exposure amount for causing no unevenness in the ink density of the image area on the 600th printed material was determined to relatively evaluate the sensitivity. Specifically, the sensitivity was calculated according to the formula shown below using Comparative Examples 1 to 4 as the criterions (100) respectively. The larger number means the higher sensitivity.

Sensitivity=(Exposure amount of criterion lithographic printing plate precursor)/(Exposure amount of subject lithographic printing plate precursor)×100

<Printing Durability>

As increase in the number of printing sheets according to the printing as described above, the image-forming layer was gradually abraded to cause decrease in the ink receptivity, resulting in decrease of ink density on printing paper. On the printing plate obtained by exposing in the same exposure amount (90 μJ/cm$^2$), a number of printed materials obtained until the ink density (reflection density) decreased by 0.1 from that at the initiation of printing was determined to relatively evaluate the printing durability. Specifically, the printing durability was calculated according to the formula shown below using Comparative Examples 1 to 4 as the criterions (100) respectively. The larger number means the higher printing durability.

Printing durability=(Number of printed materials obtained from subject lithographic printing plate)/(Number of printed materials obtained from criterion lithographic printing plate)×100

<Stain Resistance>

In the evaluation of printing durability, the 500th sheet of the printed material from the initiation of printing was picked up and the density of ink adhered on the non-image area was measured to relatively evaluate the stain resistance. Specifically, the stain resistance was calculated according to the formula shown below using Comparative Examples 1 to 4 as the criterions (100) respectively. The larger number means lower ink density adhered on the non-image area, that is, better stain resistance.

Stain resistance=(Ink density of non-image area on printed material obtained from criterion lithographic printing plate)/(Ink density of non-image area on printed material obtained from subject lithographic printing plate)×100

TABLE 1

| | Lithographic printing plate precursor | Polymer Compound | Developing Property | | Sensitivity | | Printing Durability | | Stain Resistance | |
|---|---|---|---|---|---|---|---|---|---|---|
| | | | Without Heating | With Heating | Without Heating | With Heating | Without Heating | With Heating | Without Heating | With Heating |
| Example 1 | 1 | P-1 | 100 | 100 | 120 | 120 | 140 | 140 | 120 | 120 |
| Comparative Example 1 | 2 | C-1 | 100 | 100 | 100 | 100 | 100 | 100 | 100 | 100 |
| Example 2 | 3 | P-2 | 100 | 100 | 140 | 140 | 160 | 160 | 110 | 110 |
| Comparative Example 2 | 4 | C-2 | 100 | 100 | 100 | 100 | 100 | 100 | 100 | 100 |
| Example 3 | 5 | P-5 | 100 | 100 | 110 | 110 | 130 | 130 | 130 | 130 |
| Comparative Example 3 | 6 | C-3 | 100 | 100 | 100 | 100 | 100 | 100 | 100 | 100 |
| Example 4 | 7 | P-6 | 100 | 100 | 130 | 130 | 150 | 150 | 110 | 110 |
| Comparative Example 4 | 8 | C-4 | 100 | 100 | 100 | 100 | 100 | 100 | 100 | 100 |

(C-1)

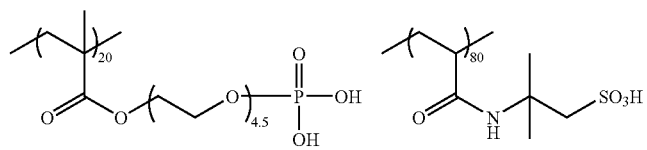

(C-2)

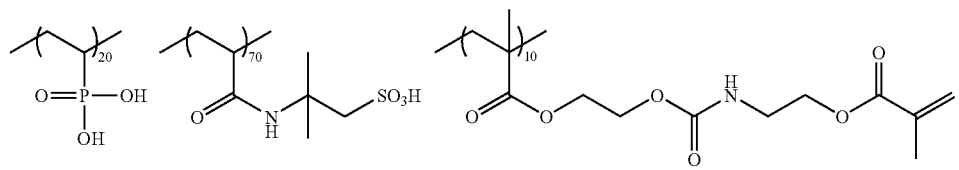

TABLE 1-continued

| Lithographic | | Developing Property | | Sensitivity | | Printing Durability | | Stain Resistance | |
|---|---|---|---|---|---|---|---|---|---|
| printing plate precursor | Polymer Compound | Without Heating | With Heating | Without Heating | With Heating | Without Heating | With Heating | Without Heating | With Heating |

(C-3)

(C-4)

The weight average molecular weights of Polymers C-1, C-2, C-3 and C-4 were 80,000, 100,000, 50,000 and 30,000, respectively.

As is apparent from the results shown in Table 1, the lithographic printing plate precursor using the terminal adsorbing polymer compound according to the invention is excellent in the sensitivity, printing durability and stain resistance in comparison with the lithographic printing plate precursor using the polymer compound having an adsorbing group in its polymer side chain.

Examples 5 and 6 and Comparative Examples 5 and 6

<Preparation of Lithographic Printing Plate Precursors (9) to (12)>

Lithographic Printing Plate Precursors (9) to (12) were prepared in the same manner as in Lithographic printing plate precursors (1) to (4) except for changing Coating solution 1 for image-forming layer to Coating solution 2 for image-forming layer shown below, respectively.

(Coating Solution 2 for Image-Forming Layer)

| | |
|---|---|
| Binder Polymer (4) shown below (weight average molecular weight: 60,000) | 0.54 g |
| Polymerizable Compound (2) shown below | 0.48 g |
| Sensitizing Dye (1) shown above | 0.06 g |
| Polymerization Initiator (1) shown above | 0.18 g |
| Co-sensitizer (1) shown above | 0.07 g |
| Dispersion of ∈-phthalocyanine pigment [pigment: 15 parts by weight; dispersing agent (allyl methacrylate/methacrylic acid (80/20) copolymer): 10 parts by weight; solvent (cyclohexanone/methoxypropyl acetate/1-methoxy-2-propanol = 15 parts by weight/20 parts by weight/40 parts by weight)] | 0.40 g |
| Thermal polymerization inhibitor N-nitrosophenylhydroxylamine aluminum salt | 0.01 g |
| Fluorine-Based Surfactant (1) shown above | 0.001 g |
| Polyoxyethylene-polyoxypropylene condensate (Pluronic L44, produced by ADEKA Corp.) | 0.04 g |
| Tetraethylamine hydrochloride | 0.01 g |
| 1-Methoxy-2-propanol | 3.5 g |
| Methyl ethyl ketone | 8.0 g |

Binder Polymer (4):

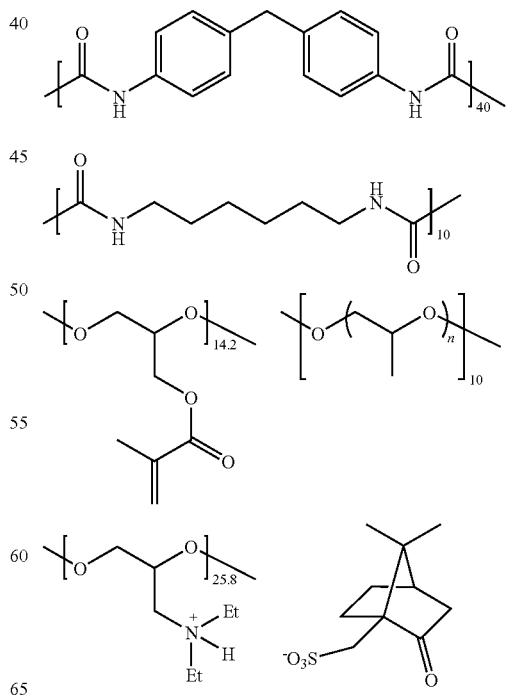

-continued

Polymerizable Compound (2):

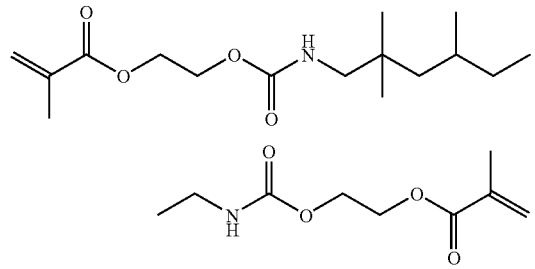

Lithographic Printing Plate Precursors (9) to (12) thus-obtained were evaluated in the same manner as in Example 1 except for changing Developer (1) to Developer (2) shown below. As the criterions (100) for the relative evaluation, Comparative Examples 5 and 6 were used, respectively. The results obtained are shown in Table 2.

| (Developer (2)) | |
|---|---|
| Water | 100.00 g |
| N-Lauryl dimethyl betaine | 10.00 g |
| (Pionin C157K, produced by Takemoto Oil & Fat Co., Ltd.) | |
| Polystyrenesulfonic acid (Mw: 20,000) | 1.00 g |
| Ammonium primary phosphate | 0.05 g |
| Citric acid | 0.05 g |
| Tetrasodium ethylenediaminetetraacetate | 0.05 g |

(pH was adjusted to 5.0 with phosphoric acid)

TABLE 2

| Lithographic | | | Developing Property | | Sensitivity | | Printing Durability | | Stain Resistance | |
|---|---|---|---|---|---|---|---|---|---|---|
| printing plate precursor | Polymer Compound | | Without Heating | With Heating | Without Heating | With Heating | Without Heating | With Heating | Without Heating | With Heating |
| Example 5 | 9 | P-1 | 100 | 100 | 130 | 130 | 140 | 140 | 120 | 120 |
| Comparative Example 5 | 10 | C-1 | 100 | 100 | 100 | 100 | 100 | 100 | 100 | 100 |
| Example 6 | 11 | P-2 | 100 | 100 | 150 | 150 | 160 | 160 | 110 | 110 |
| Comparative Example 6 | 12 | C-2 | 100 | 100 | 100 | 100 | 100 | 100 | 100 | 100 |

As is apparent from the results shown in Table 2, the terminal adsorbing polymer compound according to the invention exhibits the excellent effects in the sensitivity, printing durability and stain resistance even when it is used in the lithographic printing plate precursors wherein different kinds of binder polymer and radical polymerizable compound are used in the image-forming layers thereof.

Examples 7 and 8 and Comparative Examples 7 and 8

<Preparation of Lithographic Printing Plate Precursors (13) to (16)>
(Preparation of Aluminum Support 2)
An aluminum plate according to JIS A1050 having a thickness of 0.3 mm was subjected to surface treatment by performing processes (a) to (k) shown below in this order.
(a) Mechanical Surface Roughening Treatment
Mechanical surface roughening of the aluminum plate was conducted by means of rotating roller-form nylon brushes while supplying a suspension (having specific gravity of 1.12) of an abrasive (silica sand) in water as an abrasion slurry solution to the surface of the aluminum plate. The average particle size of the abrasive was 8 μm and the maximum particle size was 50 μm. The material of the nylon brush was 6.10 nylon, and the brush has a bristle length of 50 mm and a bristle diameter of 0.3 mm. The nylon brush was made by making holes in a stainless steel cylinder having a diameter of 300 mm and densely filling the brush bristles. Three of the rotating nylon brushes were used. Two supporting rollers (each having a diameter of 200 mm) provided under the brush rollers were spaced 300 mm. The brush rollers were pressed against the aluminum plate till the load applied to a driving motor for rotating the brush became 7 kW greater than the load before pressing the brush rollers against the aluminum plate. The rotating direction of the brushes was the same as the moving direction of the aluminum plate. The rotation number of the brushes was 200 rpm.
(b) Alkali Etching Treatment
Alkali etching treatment of the aluminum plate was conducted by spraying an aqueous sodium hydroxide solution (sodium hydroxide concentration: 26% by weight, aluminum ion concentration: 6.5% by weight) having temperature of 70° C. to dissolve the aluminum plate in an amount of 6 g/m², followed by washing by spraying well water.
(c) Desmut Treatment
Desmut treatment of the aluminum plate was conducted by spraying an aqueous 1% by weight nitric acid solution (containing 0.5% by weight of aluminum ion) having temperature of 30° C., followed by washing with water by spraying. As the aqueous nitric acid solution for the desmut treatment, a waste solution from the process of electrochemical surface roughening treatment using alternating current in an aqueous nitric acid solution.
(d) Electrochemical Surface Roughening Treatment
Electrochemical surface roughening treatment of the aluminum plate was continuously conducted by applying 60 Hz alternating current voltage. The electrolytic solution used was an aqueous solution containing 10.5 g/liter of nitric acid (containing 5 g/liter of aluminum ion) and the solution temperature was 50° C. The electrochemical surface roughening treatment was conducted using an alternating current source, which provided a trapezoidal rectangular wave alternating current where time (TP) for reaching the current to its peak from zero was 0.8 msec and a duty ratio was 1:1, and using a carbon electrode as a counter electrode. A ferrite was used as an auxiliary anode. The electrolytic cell used was a radial cell type. The current density was 30 A/dm² at the peak current, and the electric amount was 220 C/dm² in terms of the total electric quantity during the aluminum plate functioning as an anode. To the auxiliary anode, 5% of the current from the electric source was divided. Subsequently, the plate was washed by spraying well water.

(e) Alkali Etching Treatment

Alkali etching treatment of the aluminum plate was conducted at 32° C. by spraying an aqueous solution having a sodium hydroxide concentration of 26% by weight and an aluminum ion concentration of 6.5% by weight to dissolve the aluminum plate in an amount of 0.20 g/m². Thus, the smut component mainly comprising aluminum hydroxide formed in the precedent process of electrochemical surface roughening treatment using alternating current was removed and an edge portion of the pit formed was dissolved to smoothen the edge portion. Subsequently, the plate was washed by spraying well water.

(f) Desmut Treatment

Desmut treatment of the aluminum plate was conducted by spraying an aqueous 15% by weight nitric acid solution (containing 4.5% by weight of aluminum ion) having temperature of 30° C., followed by washing by spraying well water. As the aqueous nitric acid solution for the desmut treatment, a waste solution from the process of electrochemical surface roughening treatment using alternating current in an aqueous nitric acid solution.

(g) Electrochemical Surface Roughening Treatment

Electrochemical surface roughening treatment of the aluminum plate was continuously conducted by applying 60 Hz alternating current voltage. The electrolytic solution used was an aqueous solution containing 7.5 g/liter of hydrochloric acid (containing 5 g/liter of aluminum ion) and the solution temperature was 35° C. The electrochemical surface roughening treatment was conducted using an alternating current source which provided a rectangular wave alternating current and using a carbon electrode as a counter electrode. A ferrite was used as an auxiliary anode. The electrolytic cell used was a radial cell type. The current density was 25 A/dm² at the peak current, and the electric amount was 50 C/dm² in terms of the total electric quantity during the aluminum plate functioning as an anode. Subsequently, the plate was washed by spraying well water.

(h) Alkali Etching Treatment

Alkali etching treatment of the aluminum plate was conducted at 32° C. by spraying an aqueous solution having a sodium hydroxide concentration of 26% by weight and an aluminum ion concentration of 6.5% by weight to dissolve the aluminum plate in an amount of 0.10 g/m². Thus, the smut component mainly comprising aluminum hydroxide formed in the precedent process of electrochemical surface roughening treatment using alternating current was removed and an edge portion of the pit formed was dissolved to smoothen the edge portion. Subsequently, the plate was washed by spraying well water.

(i) Desmut Treatment

Desmut treatment of the aluminum plate was conducted by spraying an aqueous 25% by weight sulfuric acid solution (containing 0.5% by weight of aluminum ion) having temperature of 60° C., followed by washing by spraying well water.

(j) Anodizing Treatment

Anodizing treatment of the aluminum plate was conducted using sulfuric acid as an electrolytic solution. Specifically, the electrolytic solution was an aqueous solution having sulfuric acid concentration of 170 g/liter (containing 0.5% by weight of aluminum ion) and the solution temperature was 43° C. The current density was about 30 A/dm². The amount of the final anodic oxide film was 2.7 g/m². Subsequently, the plate was washed by spraying well water.

(k) Alkali Metal Silicate Treatment

Alkali metal silicate treatment (silicate treatment) of the aluminum plate was conducted by immersing the aluminum plate in an aqueous 1% by weight sodium silicate No. 3 solution having temperature of 30° C. for 10 seconds. Subsequently, the plate was washed by spraying well water, whereby Aluminum support 2 was prepared. The adhesion amount of the silicate was 3.6 mg/m².

(Formation of Under Layer)

A coating solution for under layer having the composition shown below was coated on Aluminum support 2 described above so as to have a dry coating amount of 10 mg/m² and dried at 100° C. for 1 minute to form an under layer.

<Coating Solution for Under Layer>

| Polymer compound shown in Table 3 below | 1 g |
| Methanol | 1,000 g |

(Formation of Image-Forming Layer)

Coating solution 3 for image-forming layer having the composition shown below was coated on the under layer using a bar and dried in an oven at 70° C. for 60 seconds to form an image-forming layer having a dry coating amount of 1.0 g/m², thereby preparing Lithographic Printing Plate Precursors (13) to (16), respectively.

<Coating Solution 3 for Image-Forming Layer>

| Binder Polymer (1) shown below | 0.50 g |
| Polymerizable compound | 1.15 g |
| Isocyanuric acid EO-modified triacrylate (NK Ester M-315, produced by Shin-Nakamura Chemical Co., Ltd.) | |
| Polymerization Initiator (1) shown below | 0.20 g |
| Infrared Absorbing Agent (1) shown below | 0.05 g |
| Microcapsule Solution (1) shown above | 2.00 g |
| Fluorine-Based Surfactant (1) shown above | 0.05 g |
| 1-Methoxy-2-propanol | 18.00 g |

Binder Polymer (1):

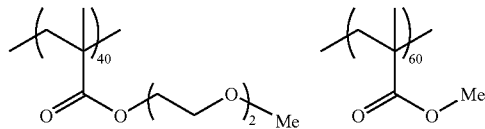

Polymerization Initiator (1):

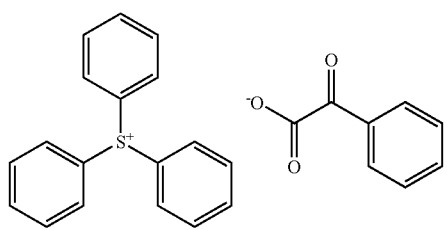

-continued

Infrared Absorbing Agent (1):

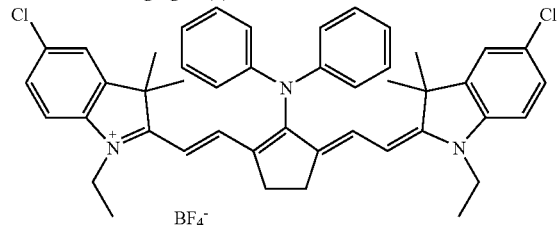

Fluorine-Based Surfactant (1):

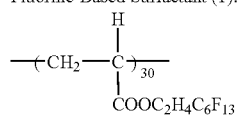

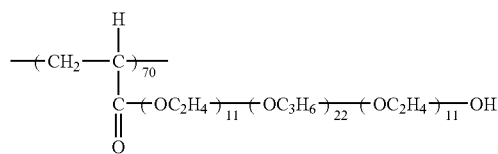

(Preparation of Microcapsule Solution (1))

As an oil phase component, 10 g of adduct of trimethylolpropane and xylene diisocyanate (Takenate D-110N, produced by Mitsui Takeda Chemicals, Inc.), 3.15 g of pentaerythritol triacrylate (SR444, produced by Nippon Kayaku Co., Ltd.), 0.35 g of Infrared Absorbing Agent (2) shown below and 0.1 g of Pionin A-41C (produced by Takemoto Oil & Fat Co., Ltd.) were dissolved in 17 g of ethyl acetate. As an aqueous phase component, 40 g of an aqueous 4% by weight PVA-205 solution was prepared. The oil phase component and the aqueous phase component were mixed and the mixture was emulsified using a homogenizer at 12,000 rpm for 10 minutes. The resulting emulsion was added to 25 g of distilled water and the mixture was stirred at room temperature for 30 minutes and then stirred at 40° C. for 3 hours. The thus-obtained microcapsule solution was diluted with distilled water so as to have a solid content concentration of 20% by weight to prepare Microcapsule Solution (1). The average particle size of the microcapsule was 0.3 μm.

(1) Exposure and Printing

Each of the lithographic printing plate precursors was exposed by Trendsetter 3244VX, produced by Creo Co., equipped with a water-cooled 40 W infrared semiconductor laser under the conditions of output of 9 W, a rotational number of an external drum of 210 rpm and resolution of 2,400 dpi. The exposed lithographic printing plate precursor was mounted without undergoing development processing on a cylinder of a printing machine (SOR-M, produced by Heidelberg Co.). After supplying dampening water (EU-3 (etching solution, produced by Fuji Film Co., Ltd.))/water/isopropyl alcohol=1/89/10 (by volume ratio)) and TRANS-G (N) black ink (produced by Dainippon Ink & Chemicals, Inc.), printing was performed at a printing speed of 6,000 sheets per hour.

(2) Evaluation

Using the lithographic printing plate precursor described above, developing property, sensitivity, printing durability and stain resistance were evaluated in the following manner. The results obtained are shown in Table 3.

<Developing Property>

A number of the printing papers required until the on-press development of the unexposed area of the image-forming layer on the printing machine was completed to reach a state where the ink was not transferred to the printing paper in the non-image area was measured to relatively evaluate the on-press development property. Specifically, the developing property was calculated according to the formula shown below using Comparative Examples 7 and 8 as the criterions (100) respectively. On the developing property, the larger number means the higher developing property and better performance.

Developing property=(Number of sheets required for on-press development of criterion lithographic printing plate precursor)/(Number of sheets required for on-press development of subject lithographic printing plate precursor)×100

<Sensitivity>

After performing the printing using each of the lithographic printing plates obtained by varying the exposure amount as described above and confirming that a printed material free from ink stain in the non-image area was obtained, 500 sheets were continuously printed. The exposure amount for causing no unevenness in the ink density of the image area on the 600th printed material was determined to relatively evaluate the sensitivity. Specifically, the sensitivity was calculated according to the formula shown below using Comparative Examples 7 and 8 as the criterions (100) respectively. On the sensitivity, the larger number means the higher sensitivity and better performance.

Sensitivity=(Exposure amount of criterion lithographic printing plate precursor)/(Exposure amount of subject lithographic printing plate precursor)×100

<Printing Durability>

As increase in the number of printing sheets according to the printing as described above, the image-forming layer was gradually abraded to cause decrease in the ink receptivity, resulting in decrease of ink density on printing paper. A number of printed materials obtained until the ink density (reflection density) decreased by 0.1 from that at the initiation of printing was determined to relatively evaluate the printing durability. Specifically, the printing durability was calculated according to the formula shown below using Comparative Examples 7 and 8 as the criterions (100) respectively. The larger number means the higher printing durability.

Printing durability=(Number of printed materials obtained from subject lithographic printing plate)/(Number of printed materials obtained from criterion lithographic printing plate)×100

<Stain Resistance>

In the evaluation of printing durability, the 500th sheet of the printed material from the initiation of printing was picked up and the density of ink adhered on the non-image area was measured to relatively evaluate the stain resistance. Specifically, the stain resistance was calculated according to the formula shown below using Comparative Examples 1 to 4 as the criterions (100) respectively. The larger number means lower ink density adhered on the non-image area, that is, better stain resistance.

Stain resistance=(Ink density of non-image area on printed material obtained from criterion lithographic printing plate)/(Ink density of non-image area on printed material obtained from subject lithographic printing plate)×100

TABLE 3

| | Lithographic printing plate precursor | Polymer Compound | Developing Property | | Sensitivity | | Printing Durability | | Stain Resistance | |
|---|---|---|---|---|---|---|---|---|---|---|
| | | | Without Heating | With Heating | Without Heating | With Heating | Without Heating | With Heating | Without Heating | With Heating |
| Example 7 | 13 | P-5 | 100 | 100 | 120 | 120 | 130 | 130 | 120 | 120 |
| Comparative Example 7 | 14 | C-3 | 100 | 100 | 100 | 100 | 100 | 100 | 100 | 100 |
| Example 8 | 15 | P-6 | 100 | 100 | 150 | 150 | 160 | 160 | 110 | 110 |
| Comparative Example 8 | 16 | C-4 | 100 | 100 | 100 | 100 | 100 | 100 | 100 | 100 |

As is apparent from the results shown in Table 3, the terminal adsorbing polymer compound according to the invention exhibits the excellent effects in the sensitivity, printing durability and stain resistance even when it is in the lithographic printing plate precursor using the image-forming layer of infrared laser exposure type.

Examples 9 and 14 and Comparative Example 9

<Preparation of Lithographic Printing Plate Precursors (17) to (23)>
(Formation of Under Layer)
A coating solution for under layer having the composition shown below was coated on the Aluminum support 1 having provided thereon a backcoat layer described above so as to have a dry coating amount of 10 mg/m² and dried at 100° C. for 1 minute to form an under layer.
<Coating Solution for Under Layer>

| Polymer compound shown in Table 4 below | 1 g |
|---|---|
| Methanol | 1,000 g |

(Formation of Image-Forming Layer)
Coating solution 1 for image-forming layer having the composition shown above was coated on the aluminum support provided with the under layer described above and dried in an oven at 100° C. for 60 seconds to form an image-forming layer having a dry coating amount of 1.3 g/m².
(Formation of Protective Layer)
Coating solution 1 for protective layer having the composition shown above was coated on the image-forming layer described above so as to have a dry coating amount of 0.5 g/m² and dried at 100° C. for one minute to form a protective layer, thereby preparing Lithographic Printing Plate Precursors (17) to (23).

Each of the lithographic printing plate precursors was evaluated in the same manner as in Example 1. The results obtained are shown in Table 4.

TABLE 4

| | Lithographic printing plate precursor | Polymer Compound | Developing Property | | Sensitivity | | Printing Durability | | Stain Resistance | |
|---|---|---|---|---|---|---|---|---|---|---|
| | | | Without Heating | With Heating | Without Heating | With Heating | Without Heating | With Heating | Without Heating | With Heating |
| Example 9 | 17 | P-2(9,800) | 100 | 100 | 120 | 120 | 120 | 120 | 110 | 110 |
| Example 10 | 18 | P-2(14,700) | 100 | 100 | 130 | 130 | 140 | 140 | 120 | 120 |
| Example 11 | 19 | P-2(32,300) | 100 | 100 | 140 | 140 | 160 | 160 | 130 | 130 |
| Example 12 | 20 | P-2/C-2[75/25] | 100 | 100 | 135 | 135 | 155 | 155 | 125 | 125 |
| Example 13 | 21 | P-2/C-2[50/50] | 100 | 100 | 130 | 130 | 150 | 150 | 120 | 120 |
| Example 14 | 22 | P-2/C-2[25/75] | 100 | 100 | 125 | 125 | 145 | 145 | 115 | 115 |
| Comparative Example 9 | 23 | C-2 | 100 | 100 | 100 | 100 | 100 | 100 | 100 | 100 |

In Table 4, the numeral in ( ) indicates a weight average molecular weight of the polymer compound.
The numerals in [ ] indicates a mixing ratio of the polymer compounds by weight. The weight average molecular weight of Terminal Adsorbing Polymer Compound P-2 used in the mixture is 32,300.
As is apparent from the results shown in Table 4, as the weight average molecular weight of the terminal adsorbing polymer compound increases, the sensitivity, printing durability and stain resistance become better. It is also understood that the effects of improving the sensitivity, printing durability and stain resistance are achieved even in the combination with a hydrophilic polymer compound and the effects become larger as the mixing ratio of the terminal adsorbing polymer compound increases.
The number of printed materials of the criterion lithographic printing plate for evaluating the printing durability in the evaluation results shown above is described below.
Number of printed materials of Comparative Example 1 using Polymer Compound C-1: 40,000 sheets
Number of printed materials of Comparative Example 2 using Polymer Compound C-2: 60,000 sheets
Number of printed materials of Comparative Example 3 using Polymer Compound C-3: 35,000 sheets
Number of printed materials of Comparative Example 4 using Polymer Compound C-4: 30,000 sheets
Number of printed materials of Comparative Example 5 using Polymer Compound C-1: 50,000 sheets
Number of printed materials of Comparative Example 6 using Polymer Compound C-2: 65,000 sheets
Number of printed materials of Comparative Example 7 using Polymer Compound C-3: 30,000 sheets
Number of printed materials of Comparative Example 8 using Polymer Compound C-4: 50,000 sheets
Number of printed materials of Comparative Example 9 using Polymer Compound C-2: 65,000 sheets

What is claimed is:

1. A lithographic printing plate precursor comprising, in the following order:
   a support;
   a layer comprising a polymer compound having at least three support-adsorbing groups at a terminal of a main chain; and
   a radical polymerization type image-forming layer.

2. The lithographic printing plate precursor as claimed in claim 1, wherein at least one of the at least three support-adsorbing groups is a functional group adsorbing to an aluminum support.

3. The lithographic printing plate precursor as claimed in claim 1, wherein at least one of the at least three support-adsorbing groups is an adsorbing group to an aluminum support subjected to a silicate treatment.

4. The lithographic printing plate precursor as claimed in claim 1, wherein at least one of the at least three support-adsorbing groups is selected from functional groups represented by the following formulae (1) to (13):

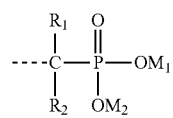
(1)

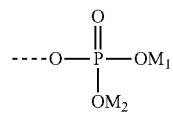
(2)

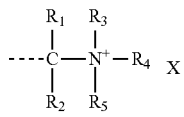
(3)

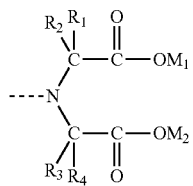
(4)

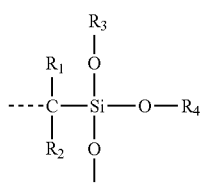
(5)

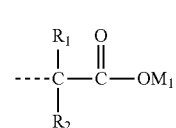
(6)

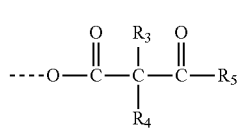
(7)

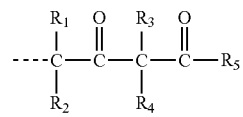
(8)

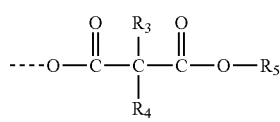
(9)

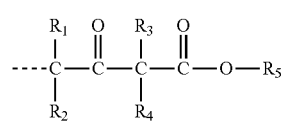
(10)

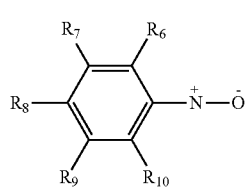
(11)

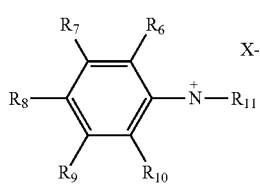
(12)

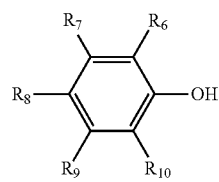
(13)

wherein a dotted line represents a bond to a connecting residue to the main chain of the polymer compound, $M_1$ and $M_2$ each independently represents a proton, a metal cation, an ammonium, a phosphonium, an iodonium, a sulfonium, a diazonium or an azinium, $R_1$ to $R_5$ each independently represents a hydrogen atom, an alkyl group, an aryl group, an alkynyl group or an alkenyl group, at least one of $R_6$ to $R_{11}$ represents a bond to a connecting residue to the main chain of the polymer compound and reminder of $R_6$ to $R_{11}$ each independently represents a hydrogen atom, a halogen atom, a cyano group, a nitro group or a monovalent organic residue, and $X^-$ represents a counter anion.

5. The lithographic printing plate precursor as claimed in claim 4, wherein at least one of the at least three support-adsorbing groups is selected from the functional groups represented by the formulae (1), (2) and (4), which are functional groups adsorbing to an aluminum support.

6. The lithographic printing plate precursor as claimed in claim 4, wherein at least one of the at least three support-adsorbing groups is selected from the functional groups represented by the formulae (3) and (4), which are adsorbing groups to an aluminum support subjected to a silicate treatment.

7. The lithographic printing plate precursor as claimed in claim 1, wherein the polymer compound comprises a unit (P1) having a hydrophilic functional group in a main chain of the polymer compound.

8. The lithographic printing plate precursor as claimed in claim 1, wherein the polymer compound comprises a unit (P2) having a carbon-carbon unsaturated double bond in a main chain of the polymer compound.

9. The lithographic printing plate precursor as claimed in claim 1, wherein the polymer compound comprises a unit (P3) having a hydrogen bond-forming group in a main chain of the polymer compound.

10. The lithographic printing plate precursor as claimed in claim 1, wherein the polymer compound comprises a unit (P1) having a hydrophilic functional group and a unit (P2) having a carbon-carbon unsaturated double bond in a main chain of the polymer compound.

11. The lithographic printing plate precursor as claimed in claim 1, wherein the polymer compound comprises a unit (P1) having a hydrophilic functional group and a unit (P3) having a hydrogen bond-forming group in a main chain of the polymer compound.

12. The lithographic printing plate precursor as claimed in claim 1, wherein the polymer compound has a weight average molecular weight of 1,000 or more.

13. The lithographic printing plate precursor as claimed in claim 12, wherein the layer comprising a polymer compound having at least three support-adsorbing groups at a terminal of a main chain further comprises a polymer compound other than the polymer compound having at least three support-adsorbing groups at a terminal of a main chain.

14. The lithographic printing plate precursor as claimed in claim 13, wherein the polymer compound other than the polymer compound having at least three support-adsorbing groups at a terminal of a main chain is a polymer compound comprising at least a unit having a support-adsorbing group and a unit (P1) having a hydrophilic functional group.

15. The lithographic printing plate precursor as claimed in claim 1, wherein the radical polymerization type image-forming layer comprises a sensitizing dye, a polymerization initiator, a radical polymerizable compound and a binder polymer.

* * * * *